United States Patent [19]
Akiyama

[11] Patent Number: 6,037,634
[45] Date of Patent: Mar. 14, 2000

[54] SEMICONDUCTOR DEVICE WITH FIRST AND SECOND ELEMENTS FORMED ON FIRST AND SECOND PORTIONS

[75] Inventor: Hajime Akiyama, Tokyo, Japan

[73] Assignee: Mitsubishi Denki Kabushiki Kaisha, Tokyo, Japan

[21] Appl. No.: 08/861,058

[22] Filed: May 21, 1997

Related U.S. Application Data

[62] Division of application No. 08/698,085, Aug. 15, 1996, abandoned.

[30]     Foreign Application Priority Data

Feb. 2, 1996   [JP]   Japan .................................. 8-017612

[51] Int. Cl.[7] .......................... H01L 21/76; H01L 27/01; H01L 27/12; H01L 31/0392
[52] U.S. Cl. ........................................... 257/347; 438/409
[58] Field of Search ...................................... 438/409, 960, 438/441, 408, 457, 455; 257/347, 350

[56]          References Cited

U.S. PATENT DOCUMENTS

| | | | |
|---|---|---|---|
| 4,878,957 | 11/1989 | Yamaguchi et al. | 148/33.3 |
| 5,071,785 | 12/1991 | Nakazato et al. | 437/62 |
| 5,160,985 | 11/1992 | Akiyama . | |
| 5,182,626 | 1/1993 | Akiyama et al. . | |
| 5,292,672 | 3/1994 | Akiyama et al. . | |
| 5,308,776 | 5/1994 | Gotou | 437/74 |
| 5,374,329 | 12/1994 | Miyawaki | 148/DIG. 12 |
| 5,443,661 | 8/1995 | Oguro et al. | 437/62 |
| 5,453,394 | 9/1995 | Yonehara et al. | 437/62 |
| 5,517,047 | 5/1996 | Linn et al. | 257/347 |
| 5,599,722 | 2/1997 | Sugisaka et al. | 438/406 |
| 5,801,084 | 9/1998 | Beasom et al. | 438/457 |

FOREIGN PATENT DOCUMENTS

| | | |
|---|---|---|
| 0 335 741 | 10/1989 | European Pat. Off. . |
| 0 547 677 | 6/1993 | European Pat. Off. . |
| 62 203364 | 9/1987 | Japan . |
| 3 50817 | 3/1991 | Japan . |
| WO 93/26041 | 12/1993 | WIPO . |

OTHER PUBLICATIONS

Proc. of the 6th Internat. Symposium on Power Semiconductor Devices & IC's, pp. 183–186, May 31–Jun. 2, 1994, Yoshiro Baba, et al., "High Voltage Trench Drain LDMOS–FET Using SOI Wafer".

J. Appl. Phys., vol. 54, No. 11, pp. 6672–6686, Nov. 1983, C.H. Hsueh, et al., "Oxidation Induced Stresses and Some Effects on the Behavior of Oxide Films".

ISPSD, pp. 31–35, 1991, S. Merchant, et al., "Realization of High Breakdown Voltage (> 700 V) In Thin SOI Devices".

IEDM, pp. 141–144, 1991, N. Yasuhara, et al., "SOI Device Structures Implementing 650 V High Voltage Output Devices on VLSIs".

Patent Abstracts of Japan, vol. 14, No. 99 (E–0893), Feb. 22, 1990, JP 1–302740, Dec. 6, 1989.

Patent Abstracts of Japan, vol. 7, No. 13 (E–153), Jan. 19, 1983, JP 57–170539, Oct. 20, 1982.

*Primary Examiner*—Brian Dutton
*Attorney, Agent, or Firm*—Oblon, Spivak, McClelland, Maier & Neustadt, P.C.

[57]          ABSTRACT

An SOI semiconductor substrate of a semiconductor device includes an SOI layer, an embedded oxide film, a semiconductor substrate, an insulating layer, and a protective coat. The protective coat protects the insulating layer from an oxide film etchant in semiconductor manufacturing processes. The stress applied between the semiconductor substrate, embedded oxide film, and insulating layer is relaxed and restrained.

8 Claims, 18 Drawing Sheets

BACKROUND ART

BACKROUND ART

SEMICONDUCTOR DEVICE WITH FIRST AND SECOND ELEMENTS FORMED ON FIRST AND SECOND PORTIONS

This application is a Division of application Ser. No. 08/698,085, filed on Aug. 15, 1996, now abandoned.

BACKGROUND OF THE INVENTION

1. Field of the Invention

The present invention relates to a semiconductor device, and particularly to a high voltage IC (HVIC) using a silicon substrate on an insulator (SOI) and its manufacturing method.

2. Discussion of the Background

FIG. 25 is an illustration showing a background high voltage IC (HVIC). As shown in FIG. 25, the high voltage IC (HVIC) includes a control section and a power section. The control section includes an oscillation circuit, a control circuit, a logic circuit, a current limit control circuit, a level shift circuit, and an overheat protection circuit, and the power section serves as a high-breakdown-voltage power device. This construction makes it possible to design on one chip both logic LSIs, such as a CMOS and a Bipolar-CMOS constituting the control section, and the high-breakdown-voltage power device constituting the power section.

FIG. 26 is a sectional view showing a high voltage IC (HVIC) using a background SOI substrate. In FIG. 26, the high voltage IC (HVIC) includes a semiconductor substrate 101, an embedded oxide film 102, a SOI layer 103 serving as a device forming region, a silicon oxide film 104, and a device separation region 133. A plurality of CMOSs and Bipolar-CMOSs of the control section are formed on one side separated by the device separation region 133, and a plurality of IGBTs (Insulated Gate Bipolar Transistors) of the power section are formed on the other side separated by the region 133.

An SOI substrate includes the semiconductor substrate 101, embedded oxide film 102, and SOI layer 103. In CMOS and Bipolar-CMOS forming regions, a plurality of wells and source/drains are formed on the SOI layer 103 and one or more gates and electrodes are formed on each well and source/drain region. In an IGBT forming region, a plurality of emitters and collectors are formed on the SOI layer 103 and one or more gates and electrodes are formed on the emitter and collector regions.

By using an SOI substrate, it is possible to decrease parasitic capacitance between devices and between a device and the substrate. Moreover, by combining the SOI substrate with the trench separation technique, it is possible to realize complete dielectric separation. Thereby, the reliability of device operations is improved and a surface separation area can be decreased. Therefore, it is possible to improve the integration level of a chip.

Moreover, by using the SOI substrate, a breakdown voltage can be raised by the RESURF (REduced SURface Field) effect and a design of the breakdown voltage can be done relatively easily by combining SOI substrate parameters such as an SOI thickness (tsoi), SOI specific resistance (rsoi), and embedded oxide film thickness (toxi). It is shown in an article, "S. Merchant,: ISPSD Proc., 1991, pp. 31–35, REALIZATION OF HIGH BREAKDOWN VOLTAGE (>700 V) IN THIN SOI DEVICES", that the combination of thickness of an SOI layer and an embedded oxide film is effective to design a high breakdown voltage.

The RESURF effect is described below by referring to FIG. 27. FIG. 27 is a sectional view showing an SOI diode which includes a semiconductor substrate 101, an embedded oxide film layer 102, and an SOI layer 103. As shown in FIG. 27, a P+ region 106 serving as an anode of the diode and an N+ region 107 serving as a cathode of the diode are formed on the N− SOI layer 103.

By applying a reverse-blocking voltage to the SO diode, a depletion layer extends horizontally up to the broken lines A and B. The extension of the depletion layer is mainly determined by the concentration of the N− SOI layer 103. Moreover, by forming a short circuit between a back grounded electrode (not illustrated) and the P+ region 106, the depletion layer vertically extends to the broken lines A and C. A field intensity is shown by the following expression.

Field intensity E=Power supply voltage VCC/Depletion layer width W.

For the same power supply voltage, field intensity depends on a depletion layer width. Therefore, when the depletion layer width increases, field intensity in the horizontal direction can be moderated.

A method of the combination of a thickened SOI layer with a trench separation technique to raise a breakdown voltage is shown in an article, "N. Yasuhara et al.: IEDM Proc., 1991, pp. 141–144, SOI Device Structure Implementing 650 V High Voltage Output Devices on VLSIs". In this article, it is purposed to obtain a breakdown voltage of 600 V or higher by limiting the thickness of an embedded oxide film to 3 µm or less and increasing the thickness of an SOI layer up to approximately 20 µm. When a bonded SOI substrate is used, the thickness of a SOI layer can be relatively easily increased only by adjusting the polishing depth of a portion for the SOI layer.

Further, a method for realizing a high breakdown voltage by increasing the thickness of an embedded oxide film is shown in an article, "ISPSD, Proc., 1994, pp. 183–186, High Voltage Trench Drain LDMOS-FET Using SOI Wafer".

A bonded SOI substrate is used to simplify a manufacturing method to increase the thickness of an SOI layer and an embedded oxide film. In this method, a surface of a semiconductor substrate having a silicon oxide film on its surface is joined with a surface of another semiconductor substrate having or not having a silicon oxide film on its surface, and then either side is polished to obtain an SOI substrate SOI including an SOI layer, an embedded oxide film layer, and a semiconductor substrate.

When a bonded SOI substrate is used to realize a high breakdown voltage by increasing the thickness of an SOI layer, the thick SOI layer can be obtained relatively easily only by adjusting the polishing depth of a portion of the SOI layer. However, problems occur in a separation process that a trench groove must be deepened for separation and that the etching time is increased.

On the other hand, when the thickness of an embedded oxide film is increased to realize a high breakdown voltage, the warp of an SOI substrate becomes a problem. When the thickness of the embedded oxide film is increased by the CVD method to the thickness range of several microns or more, the embedded oxide film does not adhere well with a semiconductor substrate for an SOI layer due to surface roughness of the formed oxide film. Moreover, because of one side formation of an oxide film, a stress is applied between the semiconductor substrate and the embedded oxide film to cause a warp that impairs the bondage with the SOI layer.

When the thickness of an embedded oxide film is increased by thermal oxidation, an oxide film is formed on both sides of a semiconductor substrate, and thereafter, another semiconductor substrate serving as an SOI layer is bonded to either side, and an SOI substrate is formed including the SOI layer, embedded oxide film, semiconductor substrate, and oxide film. In the case of a thermal oxide film, the problem of surface roughness does not occur even in a region of a film thickness of several microns or more. Moreover, because the thermal oxide films are formed on both sides of a semiconductor substrate, stresses applied to both sides of the semiconductor substrate by the silicon oxide films are balanced so that warp does not occur when the silicon oxide films are formed.

However if the thicknesses of the silicon oxide films on the surfaces are decreased due to an oxide film etchant, at the time of SOI layer formation and in the subsequent process, and the balance of stresses applied between the semiconductor substrate and the silicon oxide films is lost between both sides of the semiconductor substrate, a warp of an SOI substrate occurs.

FIG. 28 is a sectional view showing a warp of an SOI substrate shown in "ISPSD, Proc., 1994, pp. 183–186, High Voltage Trench Drain LDMOS-FET Using SOI Wafer". In FIG. 28, the SOI substrate includes a semiconductor substrate 101, an embedded oxide film 102, and an SOI layer 103. As shown in FIG. 28, a warp in the tensile mode is recognized on the SOI substrate.

FIG. 29 is a graph showing the relation between an embedded oxide film layer toxi of an SOI substrate and warp W of the substrate with a parameter of thickness tSOI of the SOI layer 103. In the case of a 5 inch diameter substrate, warp W of the SOI substrate reaches 100 $\mu$m when the thickness toxi of the embedded oxide film 102 is 1.7 $\mu$m. The graph also shows that the warp W increases proportionally not to the thickness tSOI of the SOI layer, but to the thickness toxi of the embedded oxide film.

A warp of an SOI substrate works as a stress between a semiconductor substrate and an embedded oxide film and decreases the service life of a semiconductor device. And, in the manufacturing process of the semiconductor device, the warpage causes process troubles such as a transfer error, a defective pattern due to deviation of an exposed focal point, and a vacuum attraction error, and greatly affects the yield.

SUMMARY OF THE INVENTION

The present invention solves the above problems, and as one objective provides a high voltage semiconductor device with a long service life and provides its manufacturing method capable of avoiding process troubles caused by wafer warp and capable of maintaining the yield. The present invention avoids process troubles caused by wafer warp such as a transfer error, a defective pattern due to deviation of an exposed focal point, a vacuum attraction error, and so forth.

According to an aspect of the present invention, a semiconductor device includes a semiconductor substrate, and first and second insulating layers formed on first and second principal planes of the semiconductor substrate. A silicon layer is formed on the surface of the first insulating layer. A first element device is formed on a first portion of the exposed plane of the silicon layer, and a second element device for controlling the first device is formed on a second portion separated from the first portion of the exposed plane by a device separation region. Further, a protective coat is formed on another principal plane of the second insulating layer to protect the second insulating layer.

According to another aspect of the present invention, a semiconductor device includes a semiconductor substrate, and a first stress relaxation layer formed on one principal plane of the semiconductor substrate. A first insulating layer is formed on the first stress relaxation layer and a silicon layer is formed on the first insulating layer. Further, a first element device is formed on a first portion of the exposed plane of the silicon layer, and a second element device, for controlling the first element device, is formed on a second portion separated from the first portion of the exposed plane by a device separation region.

According to another aspect of the present invention, the semiconductor device further includes a second stress relaxation layer formed on another principal plane of a semiconductor substrate, and a second insulating layer formed on the second stress relaxation layer.

According to another aspect of the present invention, the semiconductor device further includes a protective coat formed on another principal plane of the second insulating layer to protect the second insulating layer.

Further, according to another aspect of the present invention, in a manufacturing method of a semiconductor device, first and second insulating layers are formed on first and second principal planes of a first semiconductor substrate. The exposed plane of the first insulating layer is bonded with a first principal plane of a second semiconductor substrate. A second principal plane of the second semiconductor substrate is polished up to a predetermined thickness. A first element device is formed on a first portion of the second polished principal plane of the second semiconductor substrate and a second device for controlling the first device is formed on a second portion of the exposed plane of the second semiconductor substrate.

According to another aspect of the present invention, in a manufacturing method of a semiconductor device, first and second insulating layers are formed on first and second principal planes of a first semiconductor substrate. Third and fourth insulating layers are formed on first and second principal planes of a second semiconductor substrate. The exposed plane of the first insulating layer is bonded with the exposed plane of the third insulating layer. The fourth insulating layer is removed and the second principal plane of the second semiconductor substrate is polished up to a predetermined thickness. A first element device is formed on a first portion of the second polished principal plane of the second semiconductor substrate and a second device for controlling the first device is formed on a second portion of the exposed plane of the second semiconductor substrate.

According to another aspect of the present invention, in a manufacturing method of a semiconductor device, a first stress relaxation layer is formed on a first principal plane of a first semiconductor substrate. First and second insulating layers are formed on first and second principal planes of a second semiconductor substrate. The exposed plane of the first stress relaxation layer is bonded with the exposed plane of the first insulating layer. The second insulating layer is removed, and the second principal plane of the second semiconductor substrate is polished up to a predetermined thickness. A first device is formed on a first portion of the second polished principal plane of the second semiconductor substrate, and a second device for controlling the first device is formed on a second portion of the exposed plane of the second semiconductor substrate.

According to another aspect of the present invention, in a manufacturing method of a semiconductor device, a first stress relaxation layer is formed on a first principal plane of a first semiconductor substrate. A second stress relaxation layer is formed on a second principal plane of the first semiconductor substrate. First and second insulating layers are formed on the exposed planes of the first and second stress relaxation layers. The exposed plane of the first insulating layer is bonded with a first principal plane of a second semiconductor substrate. A second principal plane of the second semiconductor substrate is polished up to a predetermined thickness. A first element device is formed on a first portion of the polished second principal plane of the second semiconductor substrate, and a second element device for controlling the first element device is formed on a second portion of the exposed plane of the second semiconductor substrate.

According to another aspect of the present invention, in a manufacturing method of a semiconductor device, first and second insulating layers are formed on first and second principal planes of a first semiconductor substrate. The exposed plane of the first insulating layer is bonded with a first principal plane of a second semiconductor substrate. Each region of the first semiconductor substrate adjacent to the first and second insulating layers is transformed into first and second stress relaxation layers. A second principal plane of the second semiconductor substrate is polished up to a predetermined thickness. A first element device is formed on a first portion of the polished second principal plane of the second semiconductor substrate, and a second element device for controlling the first device is formed on a second portion of the exposed plane of the second semiconductor substrate.

According to another aspect of the present invention, in a manufacturing method of a semiconductor device, first and second stress relaxation layers are formed on first and second principal planes of a first semiconductor substrate. First and second insulating layers are formed on the exposed planes of the first and second stress relaxation layers. Third and fourth insulating layers are formed on first and second principal planes of a second semiconductor substrate. The exposed plane of the first insulating layer is bonded with the exposed plane of the third insulating layer. The fourth insulating layer is removed, and the second principal plane of the second semiconductor substrate is polished up to a predetermined thickness. A first element device is formed on a first portion of the second polished principal plane of the second semiconductor substrate, and a second device for controlling the first device is formed on a second portion of the exposed plane of the second semiconductor substrate.

According to another aspect of the present invention, in each manufacturing method of a semiconductor device as stated above, a protective coat is further formed on the exposed plane of the second insulating layer for protecting the second insulating layer.

According to another aspect of the present invention, in a manufacturing method of a semiconductor device, first and second insulating layers are formed on both principal planes of a first semiconductor substrate. The exposed plane of the first insulating layer is bonded with a second semiconductor substrate. The surface of the second semiconductor substrate is polished up to a predetermined thickness. Grooves are formed reaching up to the first semiconductor substrate extending respectively from the exposed plane of the second insulating layer and from the second semiconductor substrate. The grooves are filled with silicon. A first element device is formed on a first portion of a main surface of the second semiconductor substrate, and a second element device for controlling the first device is formed on a second portion of the main surface of the semiconductor substrate.

According to another aspect of the present invention, in the manufacturing method of a semiconductor device as stated above, the grooves are formed in a region corresponding to a chip dicing line.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

This invention will be described in further detail by way of example with reference to the accompanying drawings.

Figure 1:
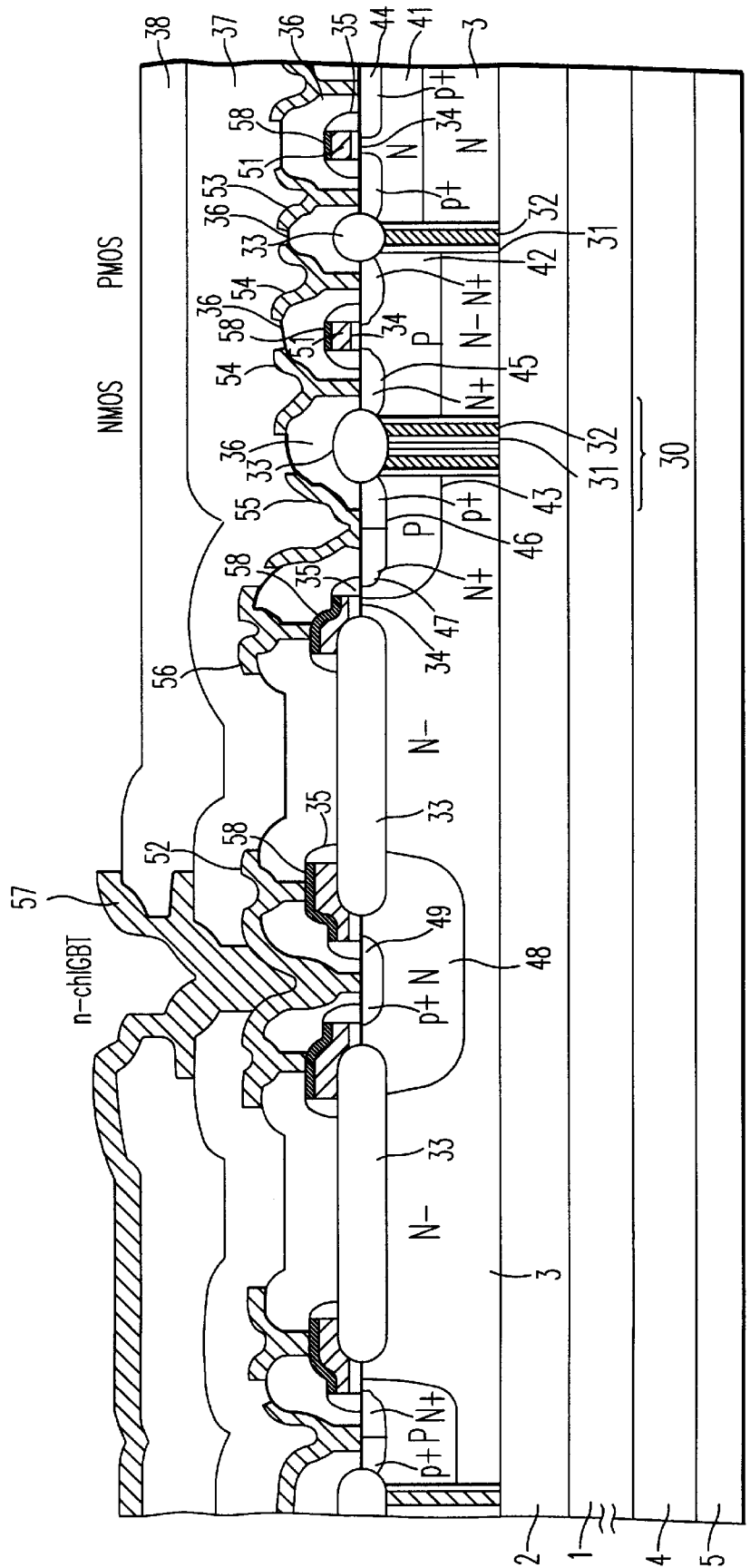
FIG. 1 is a sectional view showing a semiconductor device of a first embodiment of the present invention using a bonded SOI substrate.

FIG. 1 is a sectional view showing a semiconductor device of a first embodiment of the present invention using a bonded SOI substrate. In FIG. 1, the semiconductor device includes a semiconductor substrate 1, an embedded oxide film 2, an SOI layer 3, a silicon oxide film 4, a protective coat 5 having a resistance against an oxide film etchant, a silicon oxide film 31, a polysilicon film 32, a separation region 33, a gate oxide film 34, a side wall 35, interlayer insulating films 36 to 38, an N well 41, a P well 42, a P-type impurity diffusion layer 43, a source/drain region 44 of a PMOS, a source/drain region 45 of an NMOS, emitter regions of an n-ch IGBT 46 and 47, an N buffer region 48, a P+ collector region 49, a gate 51 of a CMOS, a gate 52 of an IGBT, a source/drain electrode 53 of a PMOS, a source/drain electrode 54 of an NMOS, an emitter electrode 55 of an n-ch IGBT, a gate electrode 56 of an n-ch IGBT, a collector electrode 57, and a barrier metal 58.

This semiconductor device includes a CMOS serving as a logic circuit and an N-type IGBT serving as a power device. The CMOS is completely insulated and separated from the IGBT by the embedded oxide film 2, a trench separation region 30 formed in the SOI layer 3 by the silicon oxide film 31 and the polysilicon film 32, and the separation region 33 including a silicon oxide film. The NMOS and PMOS of the CMOS are also separated from each other. Further, in the SOI layer 3 of the PMOS, the N well 41 and the source/drain region 44 of the PMOS are formed, and in the SOI layer 3 of the NMOS, the P well 42 and the source/drain region 45 of the NMOS are formed. And in the SOI layer 3 of the IGBT, the P-type impurity diffusion layer 43, emitter regions 46 and 47, N-type impurity diffusion layer 48, and the collector region 49 are formed.

Figure 2:
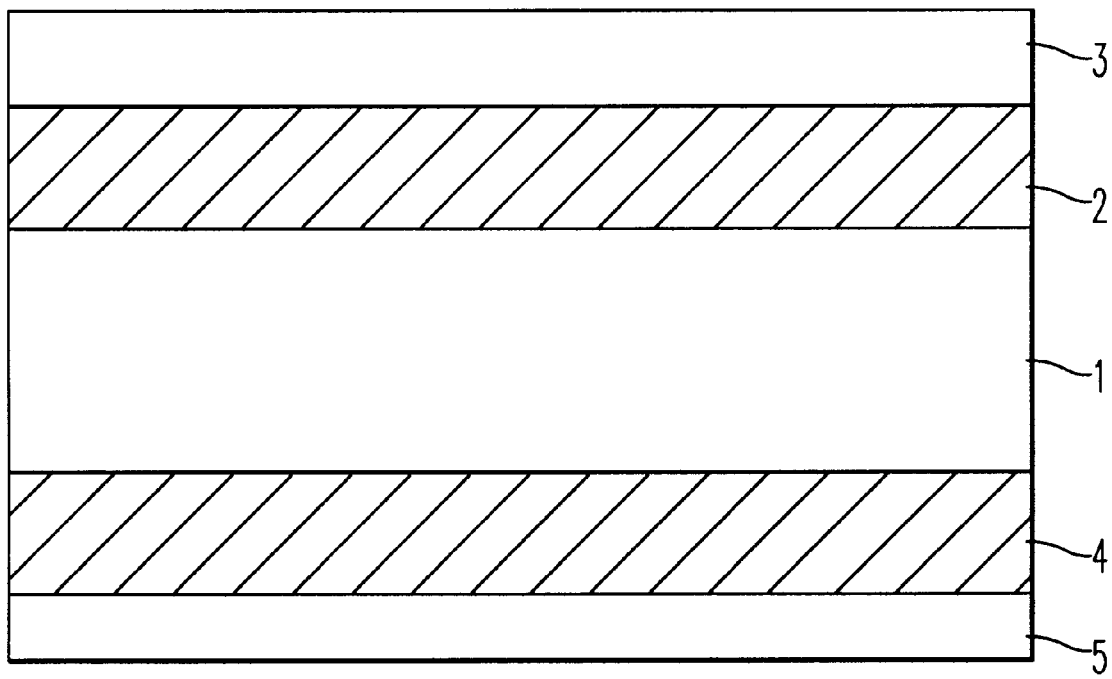
FIG. 2 is a sectional view showing an SOI substrate of the semiconductor device of the first embodiment of the present invention.

FIG. 2 is a sectional view showing an SOI substrate of the semiconductor device of the first embodiment of the present invention. In FIG. 2, the SOI substrate includes an SOI layer 3, an embedded oxide film 2, a semiconductor substrate 1, a silicon oxide film 4, and a protective coat 5 having a resistance against an oxide film etchant. The thickness of the silicon oxide film 4 is equal to or less than that of the embedded oxide film 2. However, in view of the balance of stress at both sides of the semiconductor substrate 1, it is preferable that the thickness of the film 4 is at least ½ of the thickness of the film 2 or more. A polysilicon film or a silicon nitride film is used for protective coat 5 and has a resistance against an oxide film etchant. This film 5 prevents the thickness of the silicon oxide film 4 from decreasing through semiconductor device manufacturing processes.

Figure 3:
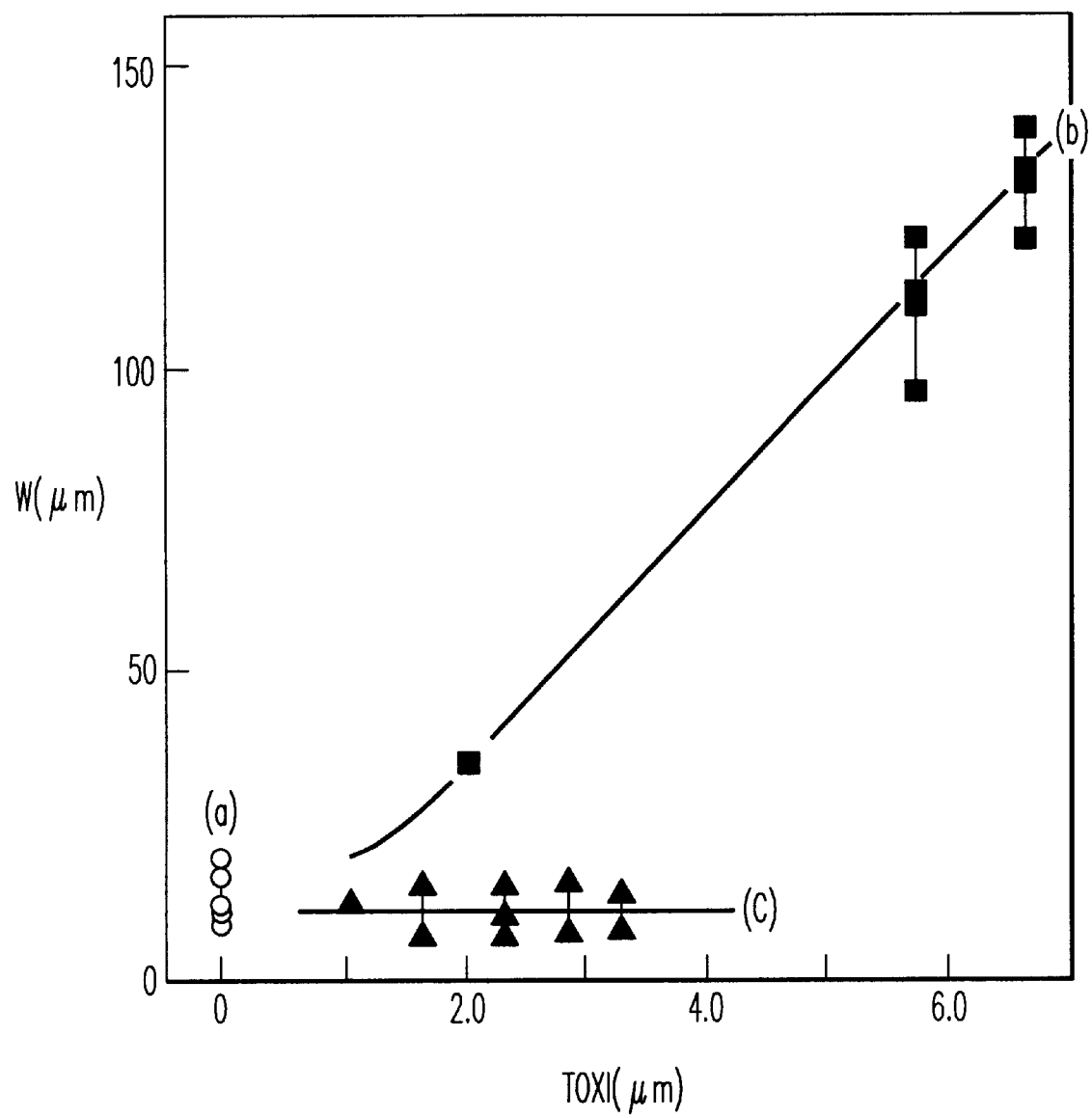
FIG. 3 is a graph showing a relation between thickness of an embedded oxide film and displacement of an SOI substrate.
Figure 4:
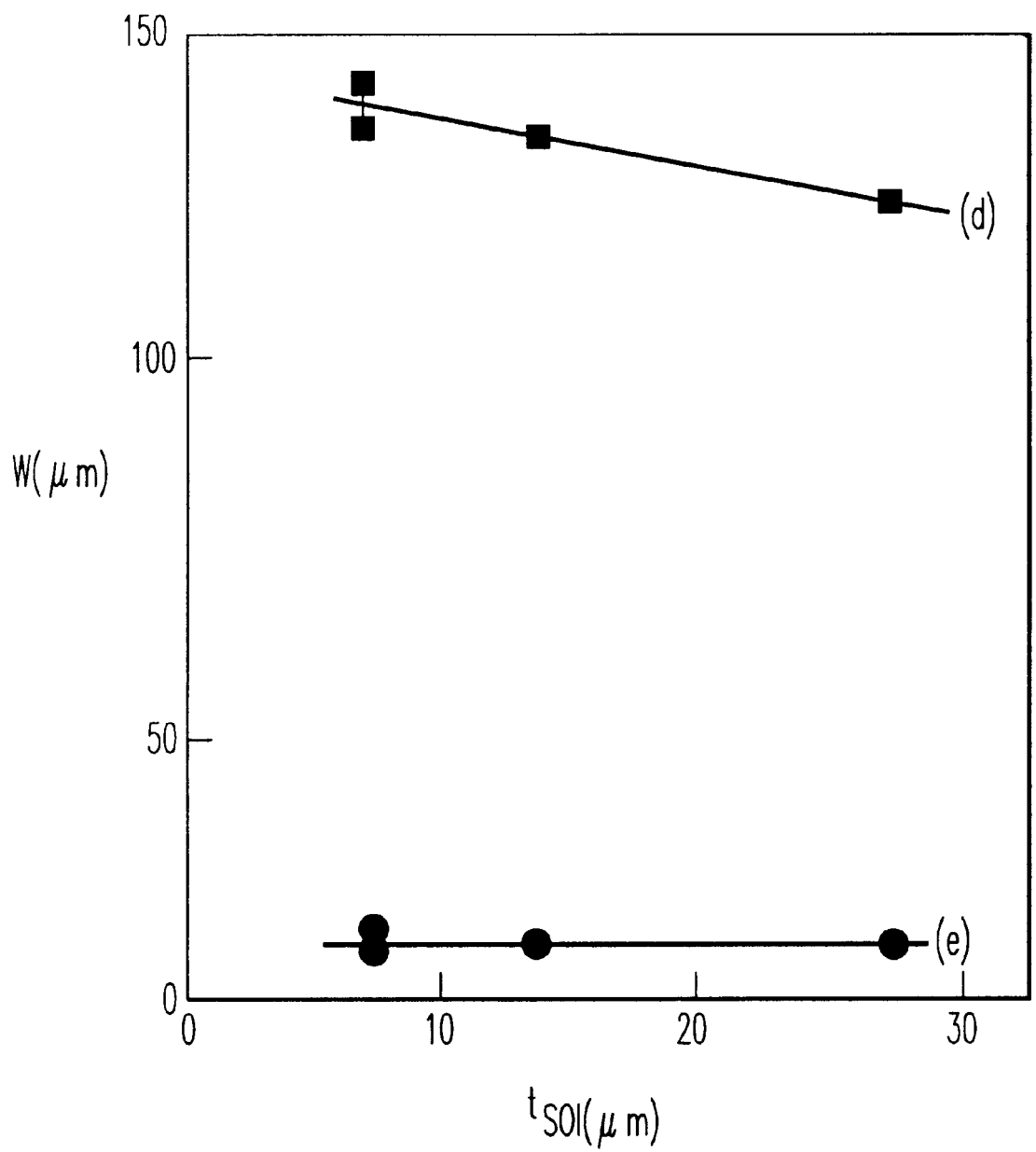
FIG. 4 is a graph showing a relation between thickness of an SOI layer and displacement of an SOI substrate.

FIG. 3 is a graph showing a relation between thickness of an embedded oxide film and displacement of a 5 inch diameter wafer, when an SOI layer of the wafer has a thickness of 7 to 14 $\mu$m. FIG. 4 is a graph showing a relation between thickness of an SOI layer and displacement of a 5 inch diameter wafer, when the SOI layer of the wafer has a thickness of 7 to 14 mm. The influence of the embedded oxide film thickness on wafer displacement is descried below by referring to FIGS. 3 and 4.

In FIG. 3, the dots (a) represent a normal semiconductor substrate, line (b) represents an SOI substrate in which the embedded oxide film 2 has a thickness two times larger than that of the silicon oxide film 4, and line (c) represents wafer displacement of an SOI substrate in which the thickness of the embedded oxide film 2 is equal to that of the silicon oxide film 4. As shown in FIG. 3, when the thickness of the embedded oxide film 2 is equal to that of the silicon oxide film 4, displacement W of the semiconductor substrate 1 is the same as that of the normal semiconductor substrate represented by dots (a) and ranges from approximately 10 to 20 $\mu$m irrespective of the increase of the oxide film thickness. As the difference between the thickness of the embedded oxide film 2 and that of the silicon oxide film 4 increases, the wafer displacement increases.

In FIG. 4, line (d) shows a relation between SOI layer thickness and wafer displacement in an SOI substrate in which the embedded oxide film 2 has a thickness of 3.3 $\mu$m and the silicon oxide film 4 has a thickness of 6.6 $\mu$m, and line (e) shows a relation between SOI layer thickness and wafer displacement in an SOI substrate in which both embedded oxide film 2 and silicon oxide film 4 have a thickness of 3.3 $\mu$m. From FIG. 4, it is recognized that the wafer displacement W is hardly influenced by the thickness of an SOI layer.

Displacement of an SOI substrate is caused by a stress applied between the semiconductor substrate 1 and the embedded oxide film 2 and silicon oxide film 4 formed on both sides of the semiconductor substrate 1. However, as described in FIG. 3, when the embedded oxide film 2 and silicon oxide film 4 have the same thickness, the balance of a stress applied between silicon substrate and silicon oxide films is maintained at both sides of the semiconductor substrate 1. Therefore, a stress produced between the semiconductor substrate 1, embedded oxide film 2, and silicon oxide film 4 is extremely restrained.

The protective coat 5 having a resistance against an oxide film etchant protects the surface of the silicon oxide film 4, prevents film thickness reduction caused in semiconductor device manufacturing processes, and maintains the thickness of the silicon oxide film 4 determined at the time of SOI substrate formation. Therefore, it is possible to keep the thickness of the embedded oxide film 2 and that of the silicon oxide film 4 equal. Thereby, because a stress produced between the semiconductor substrate 1, embedded oxide film 2, and silicon oxide film 4 is extremely restrained, a high breakdown voltage of a semiconductor device can be realized and service life of the device can be lengthened.

Even if the thickness of the embedded oxide film 2 is not equal to that of the silicon oxide film 4 at the time of SOI substrate formation, unless the difference between the thicknesses is very large, the protective coat 5 having a resistance against an oxide film etchant protects the surface of the silicon oxide film 4, prevents film thickness reduction caused in semiconductor device manufacturing processes, and maintains the thickness of the silicon oxide film 4 determined at the time of SOI substrate formation. Therefore, the same advantages as the case in which the thickness of the embedded oxide film 2 is equal to that of the silicon oxide film 4 is also obtained in view of maintaining a high breakdown voltage and securing a service life.

Figure 5:
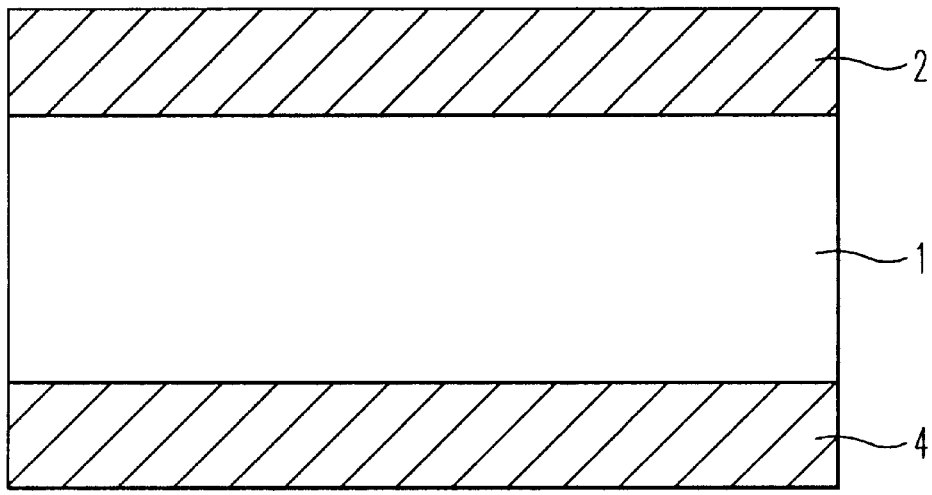
FIG. 5 is a sectional view showing a manufacturing method of the semiconductor device of the first embodiment of the present invention using a bonded SOI substrate.
Figure 6:
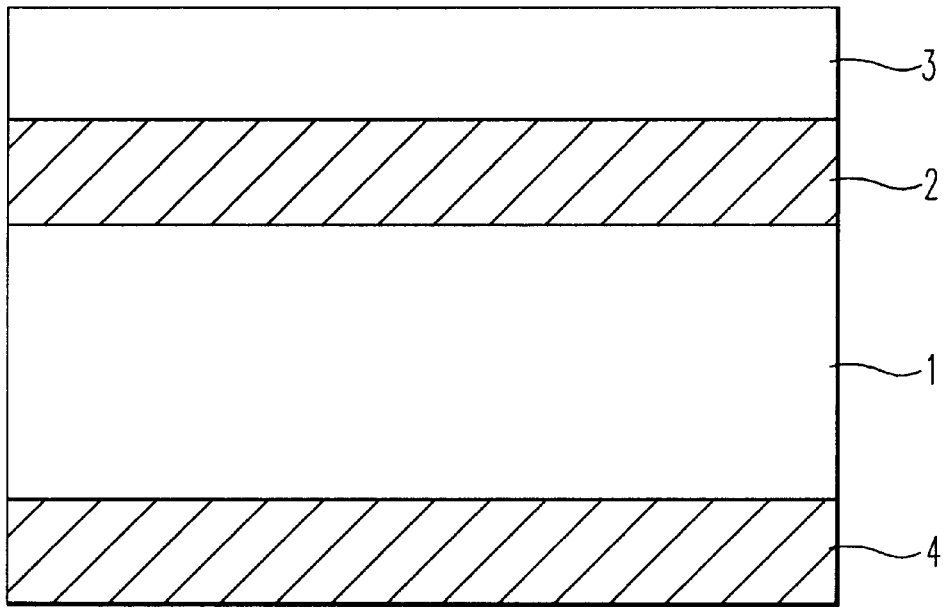
FIG. 6 is a sectional view showing a manufacturing method of the semiconductor device of the first embodiment of the present invention using a bonded SOI substrate.

FIGS. 5 and 6 are sectional views showing wafers in processes of the manufacturing method for manufacturing the semiconductor device of the first embodiment shown in FIG. 1.

First, as shown in FIG. 5, both sides of the semiconductor substrate 1 are oxidized to form the oxide films 2 and 4. To form these oxide films up to 6 $\mu$m, it is necessary to treat them by wet oxidation under normal pressure for approximately 80 hours. Then, as shown in FIG. 6, another semiconductor substrate 3 is bonded to the surface of the oxide film 2 and is then thermally treated to secure a bonding strength. In this case, the thermal treatment is continued at, for example, 1,100° C. for approximately 2 hours. By using this method, the balance of stress on both sides of the semiconductor substrate 1 is maintained because the silicon oxide films 2 and 4 formed on both sides of the semiconductor substrate 1 have almost the same thickness. Thereafter, the surface of the semiconductor substrate 3 is polished up to a predetermined thickness to form an SOI layer.

After the silicon oxide film 4, semiconductor substrate 1, embedded oxide film 2, and silicon layer 3 are formed in the above manner, the protective coat 5, such as a polysilicon film and a nitride film having a resistance against an oxide film etchant, is formed on the surface of the silicon oxide film 4 as shown in FIG. 2.

Figure 7:
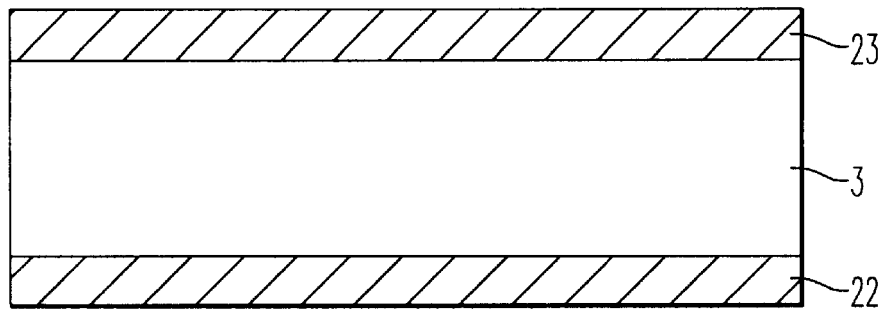
FIG. 7 is a sectional view showing a manufacturing method of the semiconductor device of the first embodiment of the present invention using a bonded SOI substrate.
Figure 7:
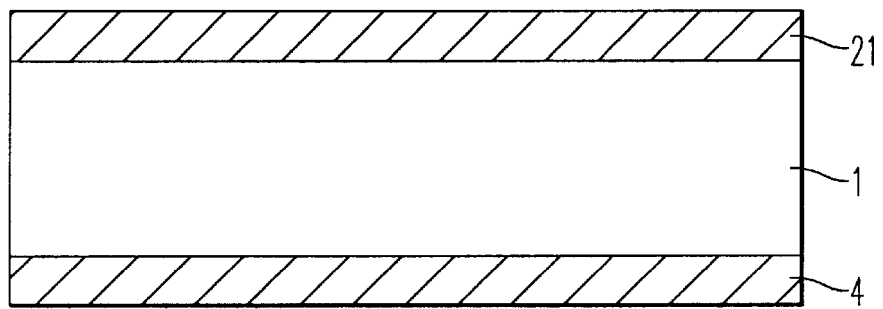
Figure 8:
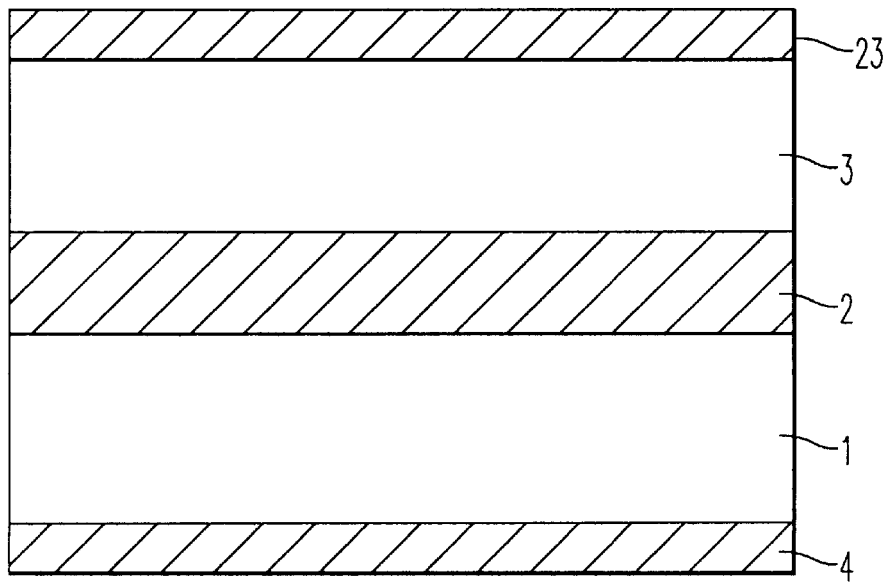
FIG. 8 is a sectional view showing a manufacturing method of the semiconductor device of the first embodiment of the present invention using a bonded SOI substrate.

FIGS. 7 and 8 are sectional views showing wafers in processes of another manufacturing method of the semiconductor device shown in FIG. 1. In FIGS. 7 and 8, symbols 21 to 23 represent silicon oxide films.

First, as shown in FIG. 7, both sides of the semiconductor substrate 1 and both sides of the semiconductor substrate 3 are oxidized to form silicon oxide films 4 and 21 on the surface of the semiconductor substrate 1 and silicon oxide films 22 and 23 on the surface of the semiconductor substrate 3. Then, as shown in FIG. 8, semiconductor substrates 21 and 22 are bonded to each other to form an integrated oxide film 2 and the bonding strength is secured by means of thermal treatment. Thereafter, the silicon oxide film 23 is removed and the semiconductor substrate 3 is polished to form an SOI layer from the semiconductor substrate 3.

In this case, the oxide films 4 and 21 and the oxide films 22 and 23, are formed with the same thickness respectively. However, the oxide films 4 and 22, 23, or the oxide films 21 and 22, 22 are not always formed with the same thickness. When considering the balance of stresses at both sides of the semiconductor substrate 1, it is preferable to equalize the thickness of the silicon oxide film 2 with that of the silicon oxide film 4, and hence to make the silicon oxide films 4 and 21 thicker than the oxide films 22 and 23. However, from the view point of an oxidation time, it is effective that all oxide films 4 and 21 to 23 have the same thickness.

Because no process trouble occurs as long as the warp of a 5 inch diameter wafer is 70 μm or less, it is possible to determine an oxidation time according to a balance between oxide film thickness and wafer warp.

After the silicon oxide film 4, semiconductor substrate 1, embedded oxide film 2, and silicon layer 3 are formed in the above manner, a protective coat 5, such as a polysilicon film and nitride film having a resistance against an oxide film etchant, is formed on the surface of the silicon oxide film 4 as shown in FIG. 2.

As described above, the protective coat 5 having a resistance against an oxide film etchant has a function for preventing the thickness of the silicon oxide film layer 4 from reducing during the device manufacturing process. Therefore, the balance of the stress produced between the semiconductor substrate 1 and the oxide films 2 and 4 formed on both sides of semiconductor substrate 1 is maintained at both sides of the semiconductor substrate 1 from when the oxide films are formed. Thereby, it is possible to restrain or decrease warp of a wafer, and to therefore decrease troubles such as imperfect attraction or transfer of the wafer to a stage in a process. Moreover, a high breakdown voltage of a semiconductor device can be realized and a service life of the device can be lengthened.

The above description has been made by using a CMOS for a logic circuit. However, besides a CMOS transistor being independently used, a combination of a bipolar transistor with a CMOS can be used. Moreover, it is possible to use a P-type IGBT, bipolar transistor, or a MOS transistor instead of an N-type IGBT as a power device.

It is also possible to oxidize the semiconductor substrate independently of the sequence. Moreover, the protective coat 5 can be formed before bonding the semiconductor substrate 1 with the semiconductor substrate 3 or before polishing the bonded semiconductor substrates.

Figure 9:
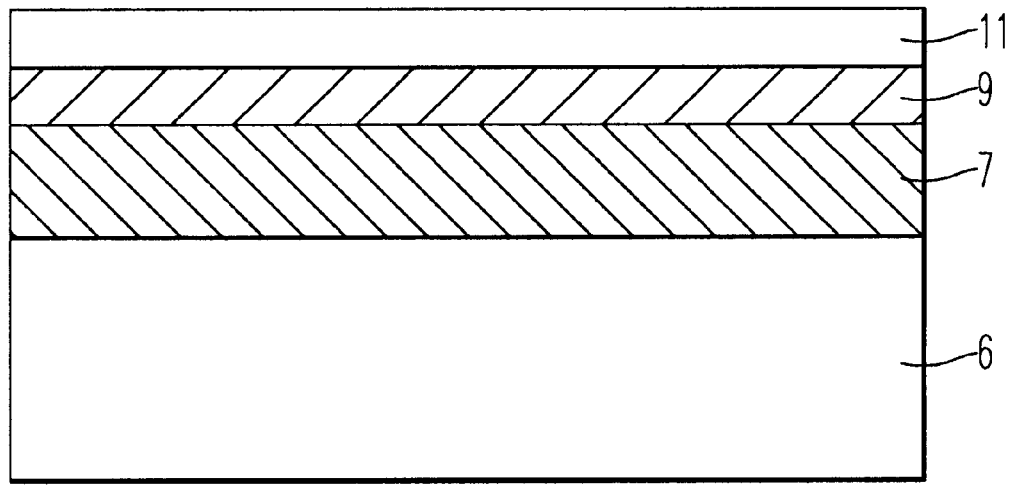
FIG. 9 is a sectional view showing an SOI semiconductor substrate of a semiconductor device of a second embodiment of the present invention.

FIG. 9 is a sectional view of an SOI substrate of a semiconductor device of a second embodiment of the present invention using a bonded SOI substrate. In FIG. 9, the SOI substrate of the semiconductor device includes a semiconductor substrate 6, a porous silicon film 7 formed on the surface of the semiconductor substrate 6, an embedded oxide film 9 formed on the surface of the porous silicon film 7, and a silicon layer 11 formed on the surface of the silicon oxide film 9. Element devices which are the same as the first embodiment are formed on the silicon layer 11 and are not again illustrated here.

The SOI substrate is displaced due to a stress applied between the semiconductor substrate 6 and the embedded oxide film 9 formed on the surface of the semiconductor substrate 6. However, as shown in FIG. 9, stress between silicon substrate 6 and silicon oxide film 9 is relaxed by the porous silicon layer 7, so that the stress produced between the semiconductor substrate 6 and the embedded oxide film 9 is restrained. This structure has the advantages that a warp is restrained without losing the RESURF effect, and the breakdown voltage of a semiconductor device is raised, and further the service life of the semiconductor device is lengthened.

Moreover, one side of the semiconductor substrate 6 is exposed, so that an electrode is easily disposed on the plane of the substrate 6 opposite to a device forming region.

Figure 10:
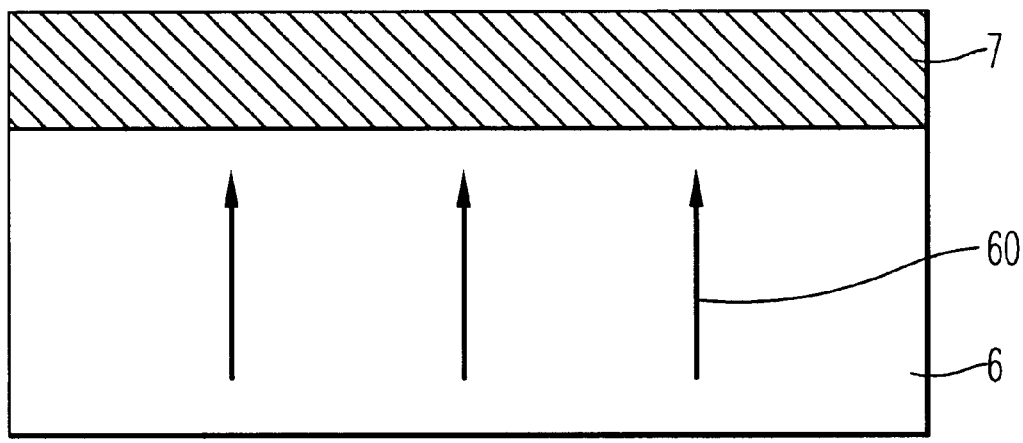
FIG. 10 is a sectional view showing a manufacturing method of the semiconductor device of the second embodiment of the present invention using a bonded SOI substrate.
Figure 11:
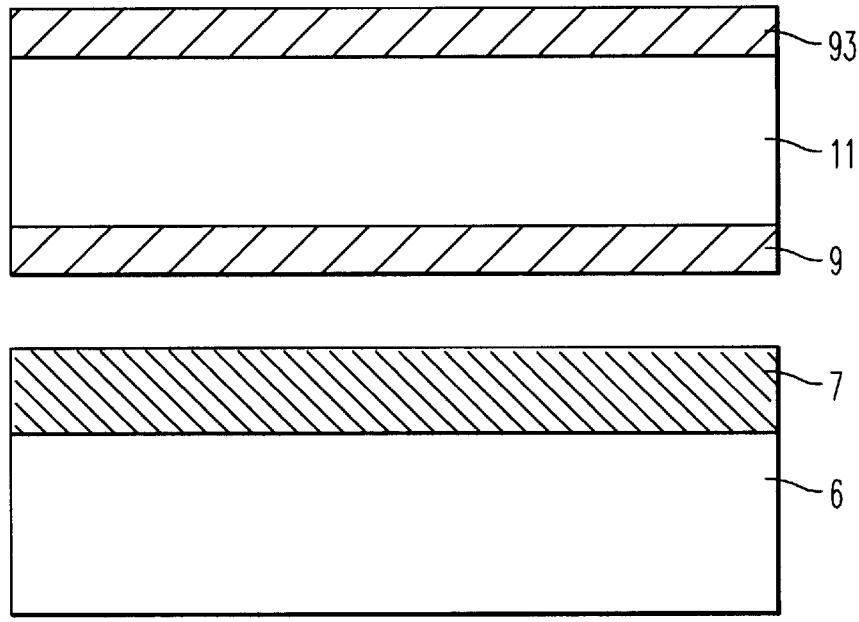
FIG. 11 is a sectional view showing a manufacturing method of the semiconductor device of the second embodiment of the present invention using a bonded SOI substrate.

FIGS. 10 and 11 are sectional views showing a manufacturing method of a wafer of the semiconductor device of the second embodiment of the present invention using a bonded SOI substrate.

A porous silicon forming method is described, for example, in a publication, "Seijiro Furukawa: SOI Structure Forming Art, pp. 176–186, SATSUMA TOSHO (transliterated)". In a formation bath having electrolyte at the top and bottom or right and left of a semiconductor substrate, HF and a platinum electrode are set as to one side for forming porous silicon as a cathode, and HF is set to the other side as a liquid electrode serving as an anode. In this case, it is possible to form porous silicon toward the inside of the semiconductor substrate from the surface of it serving as the cathode side by an anodizing current flowing through the silicon. The thickness of the porous silicon can be controlled by a current density and a formation time, and the density of the porous silicon can be controlled by the HF concentration at the time of formation.

As shown in FIG. 10, the anodizing current 60 is supplied to a semiconductor substrate 6, which is formed into P type on its surface by implanting ions of boron or the like into the surface of either P- or N- type semiconductor substrate 6, to form a porous silicon layer 7 on one side of the semiconductor substrate 6. Fine holes of the porous silicon formed by the above method are structured such that most of them are formed in a direction vertical to the surface of a semiconductor substrate.

Then, as shown in FIG. 11, the semiconductor substrate 6 on whose surface the porous silicon layer 7 is formed is bonded with a semiconductor substrate 11 on whose both sides silicon oxide films 9 and 93 are formed. Also in this case, the silicon oxide film layers 9 and 93 are formed and thermally treated to secure the bonding strength after bonding, similarly to the case of the first embodiment. Thereafter, the silicon oxide film 93 is removed as shown in FIG. 9, and the surface of the semiconductor substrate 11 is polished up to a predetermined thickness. Then, device elements are formed on the surface of the semiconductor substrate 11 similarly to the case of the first embodiment.

According to this method, the porous silicon layer 7 relaxes the stress applied between the semiconductor substrate 6 and the silicon oxide film layer 9, and therefore it is possible to decrease the displacement of a wafer, avoid imperfect attraction or transfer of the wafer to a stage in a process, and lengthen the service life of a semiconductor device.

Moreover, when performing oxidation, the rate of oxidation of porous silicon reaches up to approximately 100 times the rate of oxidation of single-crystal silicon. Therefore, there is an advantage that the treatment time for obtaining a thick oxide film is decreased.

Furthermore, because a volume change rate due to oxidation of porous silicon is shown by the following expression, it is possible to decrease volume changes before and after oxidation by controlling the porous silicon density, and to thereby decrease stretching stress.

Volume change rate R (After oxidation/Before oxidation)=2.2× Porous silicon density/single crystal silicon density.

Figure 12:
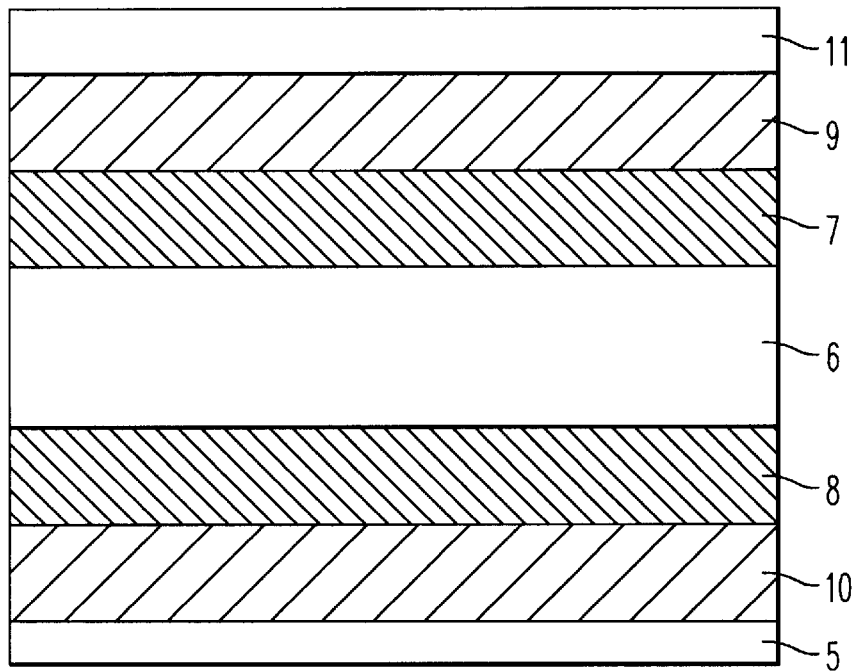
FIG. 12 is a sectional view showing an SOI substrate of the semiconductor device of the third embodiment of the present invention.

FIG. 12 is a sectional view showing a bonded SOI substrate of a semiconductor device of a third embodiment of the present invention using the bonded SOI substrate. In FIG. 12, the SOI substrate of the semiconductor device includes a semiconductor substrate 6, porous silicon films 7 and 8 formed on both sides of the semiconductor substrate 6 respectively, silicon oxide films 9 and 10 formed on the surfaces of the porous silicon films 7 and 8 respectively, an SOI layer 11 formed on the surface of the silicon oxide film 9, and a protective coat 5 having a resistance against an oxide film etchant formed on the surface of the silicon oxide film layer 10. In the case of the semiconductor device of this embodiment, device elements are formed on the SOI layer 11 in a similar way as the first embodiment and are not again illustrated here.

In FIG. 12, the thickness of the silicon oxide film 10 is equal to or less than that of the silicon oxide film 9. However, it is preferable that the thickness of the film 10 is ½ or more of the thickness of the film 9 from the viewpoint of the balance of stress at both sides of the semiconductor substrate 6. For a protective coat 5 having a resistance against an oxide film etchant, a polysilicon film and a silicon nitride film are used. The protective coat 5 prevents the thickness of the silicon oxide film 10 from decreasing in semiconductor device manufacturing processes.

Displacement of an SOI substrate is caused by a stress applied between the semiconductor substrate 6 and the embedded film 9 and the silicon oxide film 10 formed on both sides of the semiconductor substrate 6. As shown in FIG. 12, however, a stress applied between silicon substrate 6 and silicon oxide films 8 and 9 is relaxed because the porous silicon layers 7 and 8 are formed. Moreover, as described with reference to FIG. 3, when the thickness of the embedded oxide film 9 is equal to that of the silicon oxide film 10, the balance of a stress applied between silicon and a silicon oxide film is maintained at both sides of the semiconductor substrate 6. Therefore, the stress produced between the semiconductor substrate 6, embedded oxide film 9, and silicon oxide film 10 is extremely restrained.

The protective coat 5 having a resistance against an oxide film etchant protects the surface of the silicon oxide film 10, prevents film thickness reduction caused in semiconductor device manufacturing processes, and maintains the thickness of the silicon oxide film 10 determined at the time of SOI substrate formation. Therefore, it is possible to keep the thickness of the embedded oxide film 9 and that of the silicon oxide film 10 equal. Thereby, because the stress produced between the semiconductor substrate 6, embedded oxide film 9, and silicon oxide film 10 is further restrained, the breakdown voltage of a semiconductor device can be raised and the service life of the device can be lengthened.

Even if the thickness of the embedded oxide film 9 is not equal to that of the silicon oxide film 10, the porous silicon layers 7 and 8 relax a stress. Moreover, the protective coat 5 having a resistance against an oxide film etchant protects the surface of the silicon oxide film 10, prevents film thickness reduction caused in semiconductor device manufacturing processes, and maintains the thickness of the silicon oxide film 10 determined at the time of SOI substrate formation. Therefore, unless the difference between the thickness of the embedded oxide film 9 and that of the silicon oxide film 10 is very large, the same advantages as the case in which the thickness of the embedded oxide film 2 is equal to that of the silicon oxide film 4 are obtained from the viewpoint of holding a high breakdown voltage and securing a service life.

Figure 13:
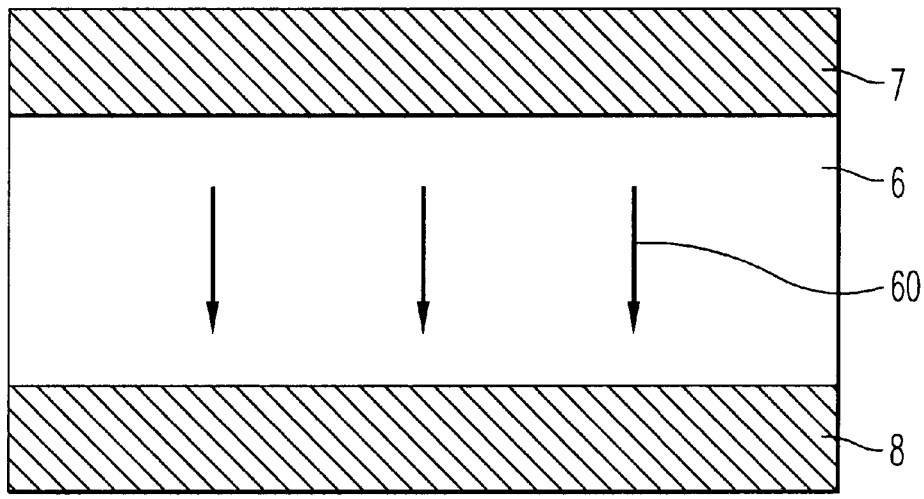
FIG. 13 is a sectional view showing a manufacturing method of the semiconductor device of the third embodiment of the present invention using a bonded SOI substrate.
Figure 14:
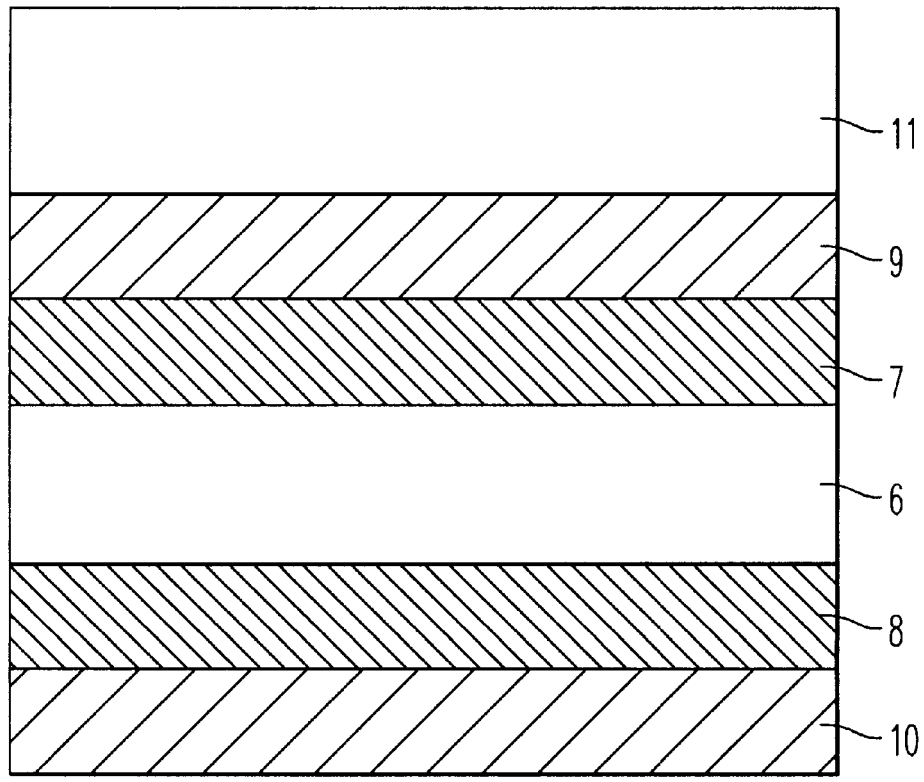
FIG. 14 is a sectional view showing a manufacturing method of the semiconductor device of the third embodiment of the present invention using a bonded SOI substrate.

FIGS. 13 and 14 are sectional views showing wafers in the processes of the semiconductor device manufacturing method of the third embodiment of the present invention for manufacturing the semiconductor device as shown in FIG. 12 using a bonded SOI substrate.

First, a porous silicon layer 7 is formed on one side of a semiconductor substrate 6 in a similar way as in the second embodiment. Then, as shown in FIG. 13, the polarity to apply the anodizing current 60 is reversed and a porous silicon layer 8 is formed on the other side of the semiconductor substrate 6. Fine holes of porous silicon formed by the above method are structured such that most of them are formed in a direction vertical to the surface of a semiconductor substrate.

Then, as shown in FIG. 14, silicon oxide film layers 9 and 10 are formed on the surfaces of porous silicon layers 7 and 8, similarly to the case of the first embodiment. And, another semiconductor substrate 11 having the silicon oxide film layer 9 is bonded, and thermally treated to secure a bonding strength. In this case, thermal treatment is performed similarly to the case of the first embodiment. By using this method, the silicon oxide films 9 and 10 are formed at almost the same thickness on both sides of the semiconductor substrate 6, and therefore, the balance of the stress is maintained at both sides of the semiconductor substrate 6. Thereafter, the surface of the semiconductor substrate 11 is polished up to a desired thickness to form an SOI layer.

The silicon oxide film 10, porous silicon layer 8, semiconductor substrate 6, porous silicon layer 7, embedded oxide film 9, and silicon layer 11 are formed in the above manner, and thereafter the protective coat 5, such as a polysilicon film and a nitride film having a resistance against an oxide film etchant, is formed on the surface of the silicon oxide film 10 as shown in FIG. 12. Then, device elements are formed on the silicon layer 11, similarly to the case of the first embodiment.

Figure 15:
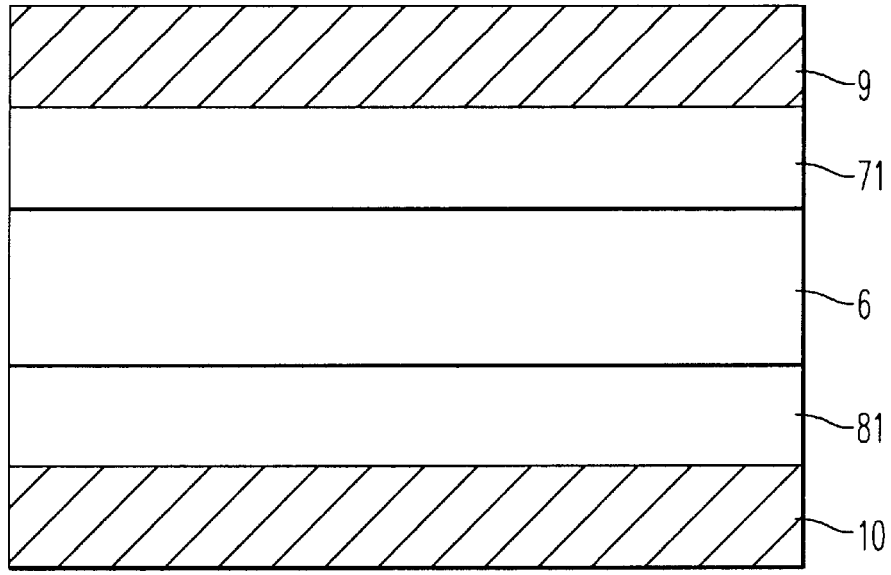
FIG. 15 is a sectional view showing a manufacturing method of the semiconductor device of the third embodiment of the present invention using a bonded SOI substrate.
Figure 16:
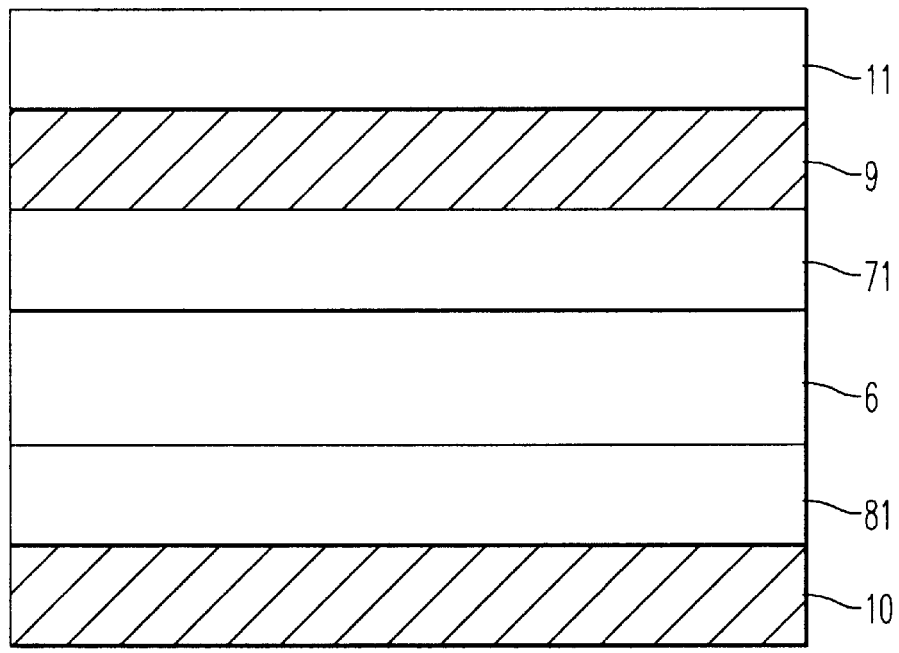
FIG. 16 is a sectional view showing a manufacturing method of the semiconductor device of the third embodiment of the present invention using a bonded SOI substrate.
Figure 17:
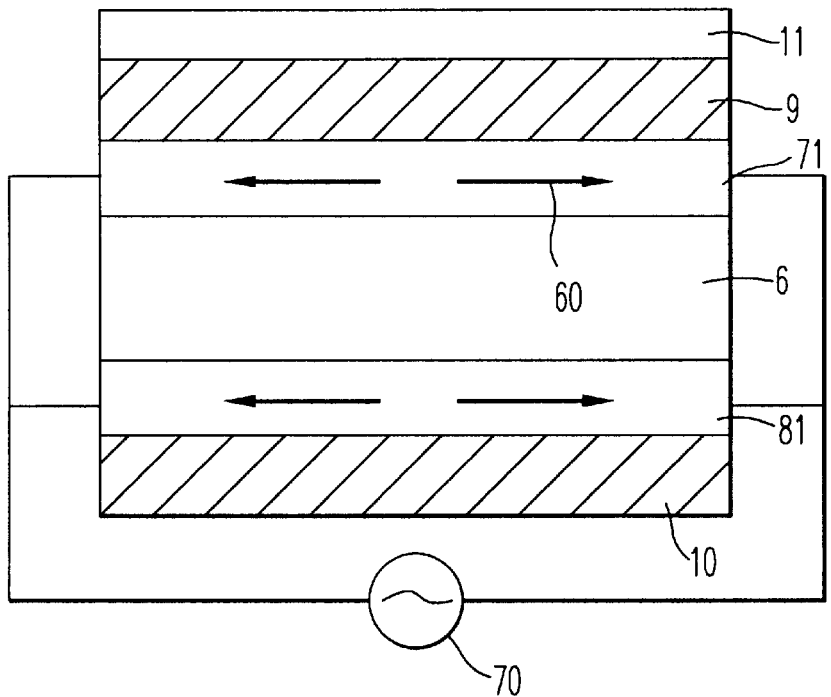
FIG. 17 is a sectional view showing a manufacturing method of the semiconductor device of the third embodiment of the present invention using a bonded SOI substrate.

FIGS. 15 to 17 are sectional views showing wafers in the processes of another semiconductor device manufacturing method of the third embodiment of the present invention for manufacturing the semiconductor device as shown in FIG. 12 using a bonded SOI substrate. In FIGS. 15 to 17, symbol 60 represents an anodizing current and 70 represents an AC power supply.

As shown in FIG. 15, epitaxial growth or implantation/diffusion of boron ions are applied to the surface of an N-type semiconductor substrate 6 to form P-type silicon layers 71 and 81, and thereafter, the surfaces of the P-type silicon layers 71 and 81 are oxidized to form silicon oxide films 9 and 10. By using this method, the silicon oxide films 9 and 10 are formed at almost the same thickness on both sides of the semiconductor substrate 6. Then, as shown in FIG. 16, the surface of the silicon oxide film 9 is bonded with another semiconductor substrate 11 and is thermally treated to secure the bonding strength. This thermal treatment is also performed similarly to the case of the first embodiment. Thereafter, the surface of the semiconductor substrate 11 is polished up to a desired thickness.

Then, as shown in FIG. 17, the AC power supply 70 is connected to both ends of not-oxidized portions of the P-type silicon layers 71 and 81 respectively, and the whole substrate is set in a porous silicon formation bath. Then, porous silicon layers 7 and 8 are formed from the edge portion toward the central portion of the substrate while supplying an anodizing current 60. The fine holes in the layers 7 and 8 are structured such that most of them are formed in a direction horizontal to the surface of the semiconductor substrate.

The silicon oxide film 10, porous silicon layer 8, semiconductor substrate 6, porous silicon layer 7, embedded oxide film 9, and silicon layer 11 are formed in the above manner, and thereafter the protective coat 5, such as a polysilicon film and a nitride film having a resistance against an oxide film etchant, is formed on the surface of the silicon oxide film 10 as shown in FIG. 12. The protective coat 5 can be formed before bonding the semiconductor substrate 11 serving as a silicon layer or before polishing the bonded semiconductor substrate 11.

Thus, by making the whole area of a step-type semiconductor substrate porous, a stress-relaxed bonded SOI substrate is obtained.

Figure 18:
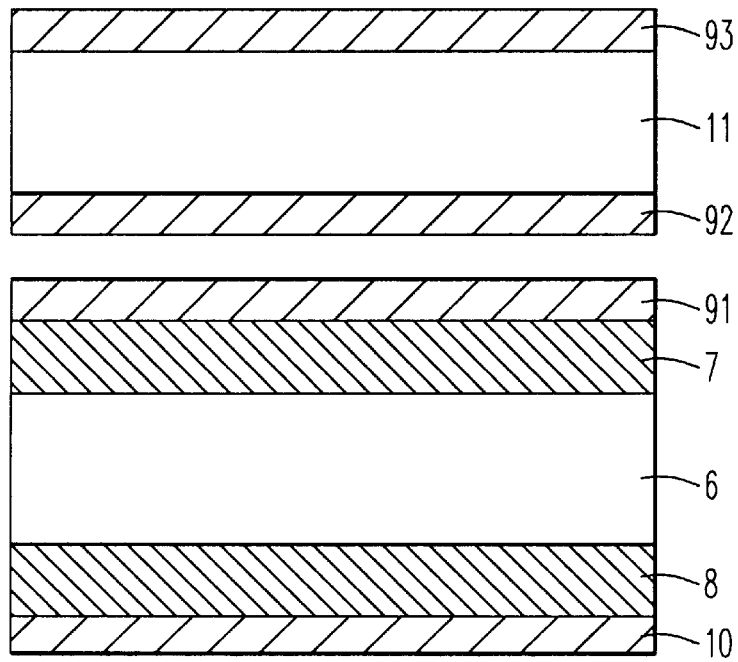
FIG. 18 is a sectional view showing a manufacturing method of the semiconductor device of the third embodiment of the present invention using a bonded SOI substrate.
Figure 19:
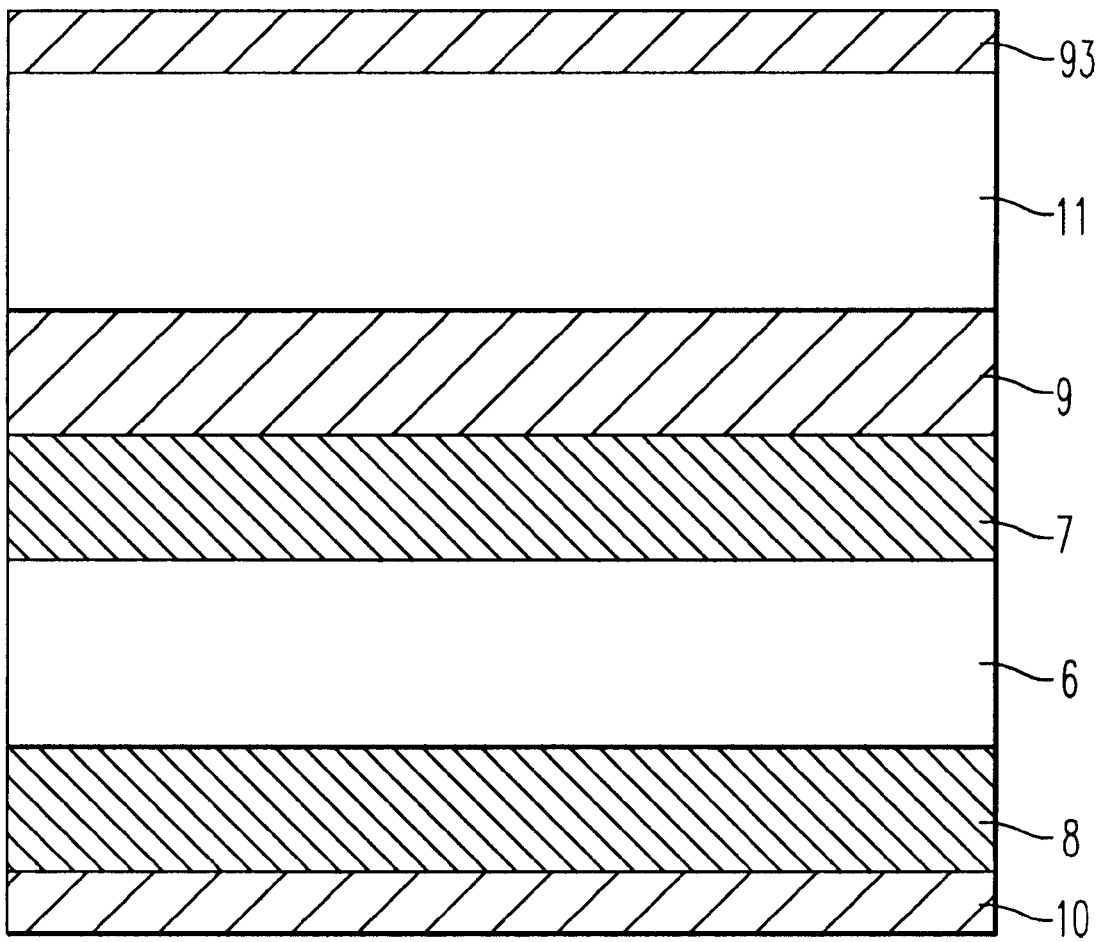
FIG. 19 is a sectional view showing a manufacturing method of the semiconductor device of the third embodiment of the present invention using a bonded SOI substrate.
Figure 20:
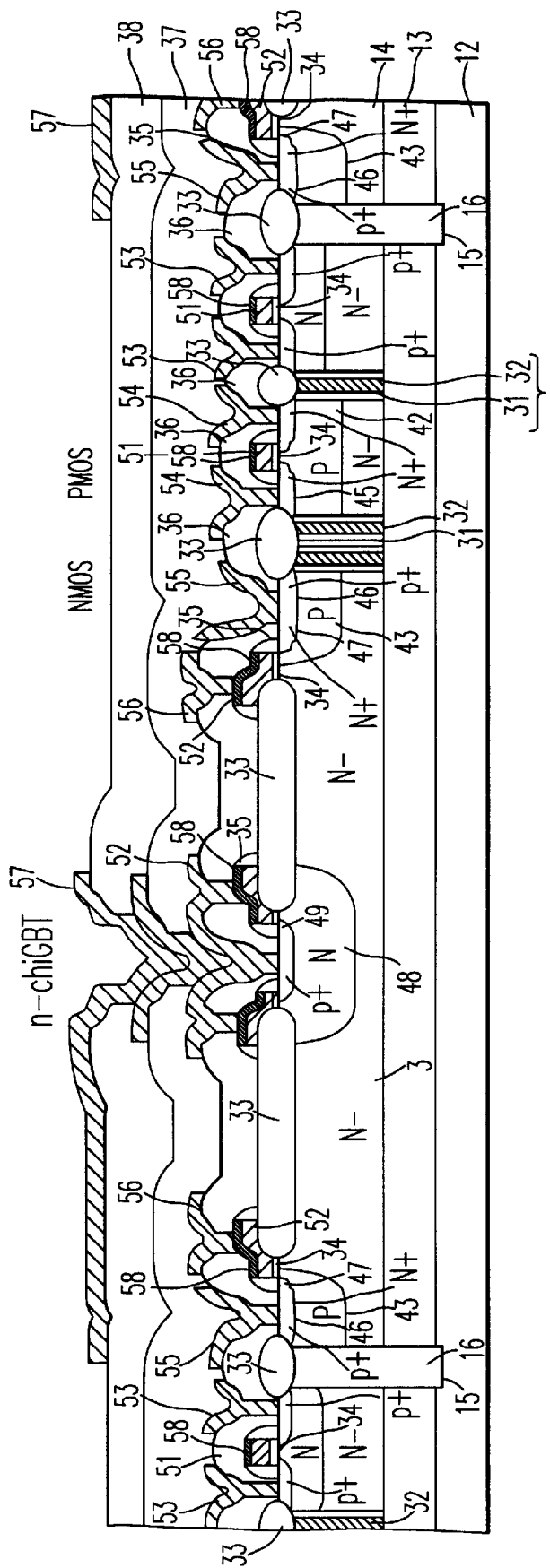
FIG. 20 is a sectional view showing an SOI substrate of a semiconductor device of a fourth embodiment of the present invention.

FIGS. 18 and 19 are sectional views showing wafers in the processes of still another semiconductor device manufacturing method of the third embodiment of the present invention for manufacturing the semiconductor device as shown in FIG. 12 using a bonded SOI substrate. In FIGS. 18 to 20, symbols 91 to 93 represent silicon oxide films.

As shown in FIG. 18, porous silicon films 7 and 8 are formed on both sides of a semiconductor substrate 6, and thereafter, silicon oxide films 91 and 10 are formed on the surfaces of the films 7 and 8. Moreover, another semiconductor substrate 11 is prepared to form silicon oxide films 92 and 93 on both sides of the semiconductor substrate 11. Then, as shown in FIG. 19, the substrates 6 and 11 are bonded to each other to form an oxide film 9 by the oxide films 91 and 92, and are then thermally treated similarly to the case of the first embodiment to secure the bonding strength. Thereafter, the silicon oxide film 93 is polished away and the semiconductor substrate 11 is partly polished.

The silicon oxide film 10, porous silicon layer 8, semiconductor substrate 6, porous silicon layer 7, embedded oxide film 9, and silicon layer 11 are formed in the above manner, and thereafter the protective coat 5, such as a polysilicon film and a nitride film having a resistance against an oxide film etchant, is formed on the surface of the silicon oxide film 10 as shown in FIG. 12. When an electrode is disposed to the surface of the semiconductor substrate 6, the porous silicon layer 8 and the silicon oxide film 10 are removed by polishing them.

In this case, the oxide films 10 and 91, and the oxide films 92 and 93, are formed at the same thickness respectively, but the oxide films 10 and 92, 93, or the oxide films 91 and 92, 93 are not always formed at the same thickness. From the viewpoint of the balance of stress at both sides of the semiconductor substrate 6, it is preferable to equalize the thickness of the silicon oxide film 9 with that of the silicon oxide film 10. Therefore, it is better to form the silicon oxide films 10 and 91 thicker than the oxide films 92 and 93. However, from the viewpoint of decreasing an oxidation time, it is effective that all the oxide films 9 and 91 to 93 have the same thickness.

Because no process trouble occurs as long as a warpage of a 5 inch diameter wafer is 70 $\mu$m or less, it is possible to determine an oxidation time according to a balance between oxide film thickness and wafer warp.

According to the above method, reflecting of stresses as a warpage of the substrate 6 is restrained and decreased because the porous silicon layers 7 and 8 absorb and relax a stress applied between the semiconductor substrate 6 and the silicon oxide film layers 9 and 10 as a deformation of fine holes.

Moreover, in the same way as in FIGS. 3 and 4, the stress produced between the semiconductor substrate 6, embedded oxide film 9, and silicon oxide film 10 is further restrained, because the balance of the stress applied between silicon and silicon oxide films is maintained at both sides of the semiconductor substrate 6, if the thickness of the embedded oxide film 9 is equal to that of the silicon oxide film 10.

The protective coat 5 having a resistance against an oxide film etchant protects the surface of the silicon oxide film 10, prevents film thickness reduction in semiconductor device manufacturing processes, and maintains the thickness of the silicon oxide film 10 determined at the time of SOI substrate formation. Therefore, it is possible to keep the thickness of the embedded oxide film 9 and that of the silicon oxide film 10 equal. Thereby, because the stress produced between the semiconductor substrate 6, embedded oxide film 9, and silicon oxide film 10 is extremely restrained, the breakdown voltage of a semiconductor device can be raised and the service life of the device can be lengthened.

The protective coat 5 having a resistance against an oxide film etchant protects the surface of the silicon oxide film 10, prevents film thickness reduction caused in semiconductor device manufacturing processes, and maintains the thickness of the silicon oxide film 10 determined at the time of SOI substrate formation. Therefore, even if the thickness of the embedded oxide film 9 is not equal to that of the silicon oxide film 10 at the time of SOI substrate formation, and unless the difference between the thicknesses is very large, the same advantages as the case in which the thickness of the embedded oxide film 9 is equal to that of the silicon oxide film 10 are also obtained from the viewpoint of high breakdown voltage and service life.

Thereby, it is possible to restrain or decrease a warp of a wafer and therefore decrease a trouble such as imperfect attraction or transfer of the wafer to a stage in a process. Moreover, the breakdown voltage of a semiconductor device can be raised and the service life of the device can be lengthened.

Further, when performing oxidation, the rate of oxidation of porous silicon reaches up to approximately 100 times the rate of oxidation of single-crystal silicon. Therefore, when obtaining a thick oxide film, the treatment time can be decreased. Furthermore, because a volume change rate due to oxidation of porous silicon is shown by the following expression, it is possible to decrease volume changes before and after oxidation by controlling the porous silicon density and thereby decreasing stretching stress.

Volume change rate R (After oxidation/Before oxidation)=2.2×
Porous silicon density/single crystal silicon density.

In addition, it is possible to form the oxide films 91 and 10 and the oxide films 92 and 93 at the same time independently of the sequence. Moreover, the protective coat 5 can be formed before bonding the semiconductor substrate 6 with the semiconductor substrate 11 or before polishing the bonded semiconductor substrates.

FIG. 20 is a sectional view showing a semiconductor device of a fourth embodiment of the present invention using a bonded SOI substrate. In FIG. 20, the semiconductor device includes a semiconductor substrate 12, an embedded oxide film 13 formed on the surface of the semiconductor substrate 12, an SOI layer 14 formed on the surface of the embedded oxide film 13, a trench groove 15 formed so as to pass through the embedded oxide film 13 from the surface of the SOI layer 14 and to reach the semiconductor substrate 12, and a groove embedded region 16 formed by polysilicon, amorphous silicon, or an epitaxially grown layer.

This semiconductor device includes a CMOS serving as a logic circuit and an N-type IGBT serving as a power device. The CMOS is completely insulated and separated from the IGBT by the embedded oxide film 13, a trench separation region 30 formed by a silicon oxide film 31 and a polysilicon film 32 in the SOI layer 14, and a separation region 33 made of a silicon oxide film. An NMOS and a PMOS of the CMOS are similarly separated from each other. Electrically integrated CMOS and IGBT regions are completely insulated from an outside region by the embedded oxide film 13, the groove 15 formed so as to reach the semiconductor substrate 12 by passing through the embedded oxide film 13 from the surface of the SOI layer 14, a groove embedded region 16 where the groove 15 is embedded by polysilicon, amorphous silicon, or epitaxial growth layer, and the separation region 33 made of a silicon oxide film.

In the SOI layer 14 of the PMOS, an N well 41 and a source/drain region 44 of the PMOS are formed; in the SOI layer 14 of the NMOS, a P well 42 and a source/drain region 45 of the NMOS are formed; and in the SOI layer 14 of the IGBT, a P-type impurity diffusion layer 43, emitter regions 46 and 47, an N-type impurity diffusion layer 48, and a collector region 49 are formed.

Figure 21:
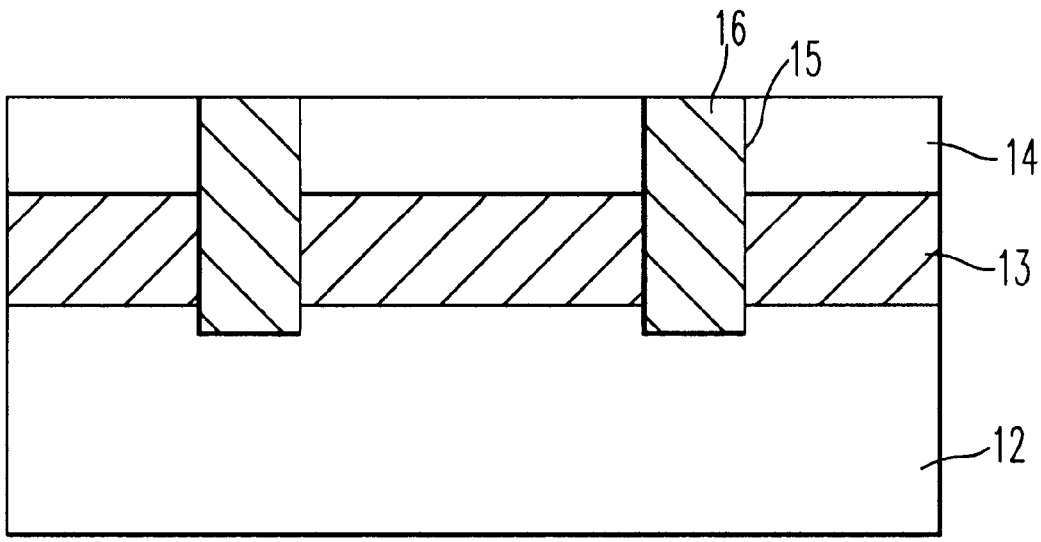
FIG. 21 is a sectional view showing a manufacturing method of the semiconductor device of the fourth embodiment of the present invention using a bonded SOI substrate.

FIG. 21 is a sectional view showing an SOI substrate of the semiconductor device of the fourth embodiment of the present invention. In FIG. 21, the SOI substrate includes an SOI layer 14, an embedded oxide film 13, and a semiconductor substrate 12, and a groove 15 formed so as to pass through the embedded oxide film 13 from the surface of the SOI layer 14 and to reach the semiconductor substrate 12. The groove 15 is embedded by polysilicon, amorphous silicon, or an epitaxial growth layer to form a groove embedded region 16. The surfaces of the SOI layer 14 and the groove embedded region 16 are flattened.

Further, the groove 15 is formed in a region, such as a chip dicing line region, which does not damage functions of a semiconductor device. The groove extremely restrains a range where a warp appears by dividing and narrowing a range influenced by a stress which is caused between the semiconductor substrate 12, embedded oxide film 13, and SOI layer 14. Therefore, the groove 15 has the advantage of decreasing the warpage of a wafer as a whole. Thereby, the breakdown voltage of a semiconductor device can be raised and the service life of the device can be lengthened.

Moreover, because the SOI layer 14 and the semiconductor substrate 12 are electrically connected to each other by the groove embedded region 16 formed by polysilicon or a selective epitaxial layer, the advantages of dissolving the condenser effect, which is a general problem for plasma-etching an SOI substrate, and of stabilizing the etching characteristic are obtained.

Figure 22:
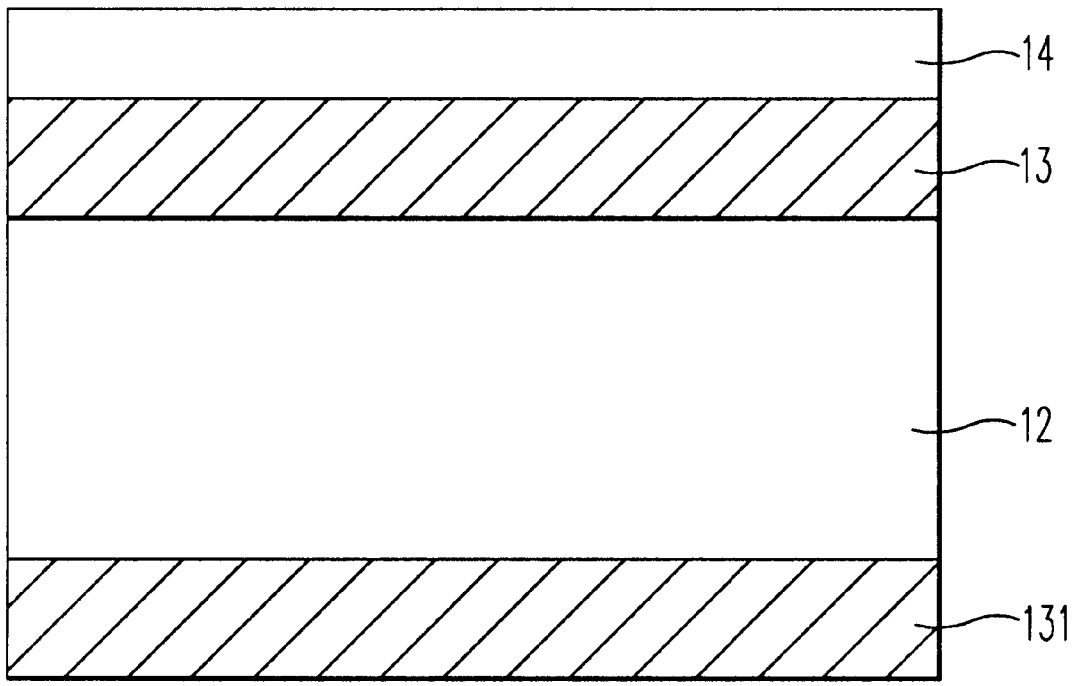
FIG. 22 is a sectional view showing a manufacturing method of the semiconductor device of the fourth embodiment of the present invention using a bonded SOI substrate.
Figure 23:
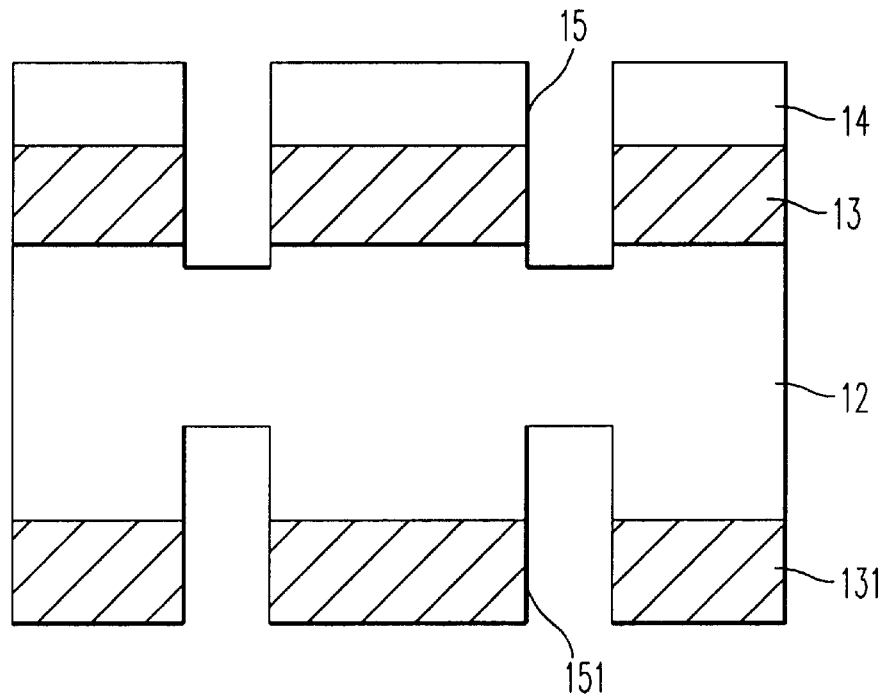
FIG. 23 is a sectional view showing a manufacturing method of the semiconductor device of the fourth embodiment of the present invention using a bonded SOI substrate.
Figure 24:
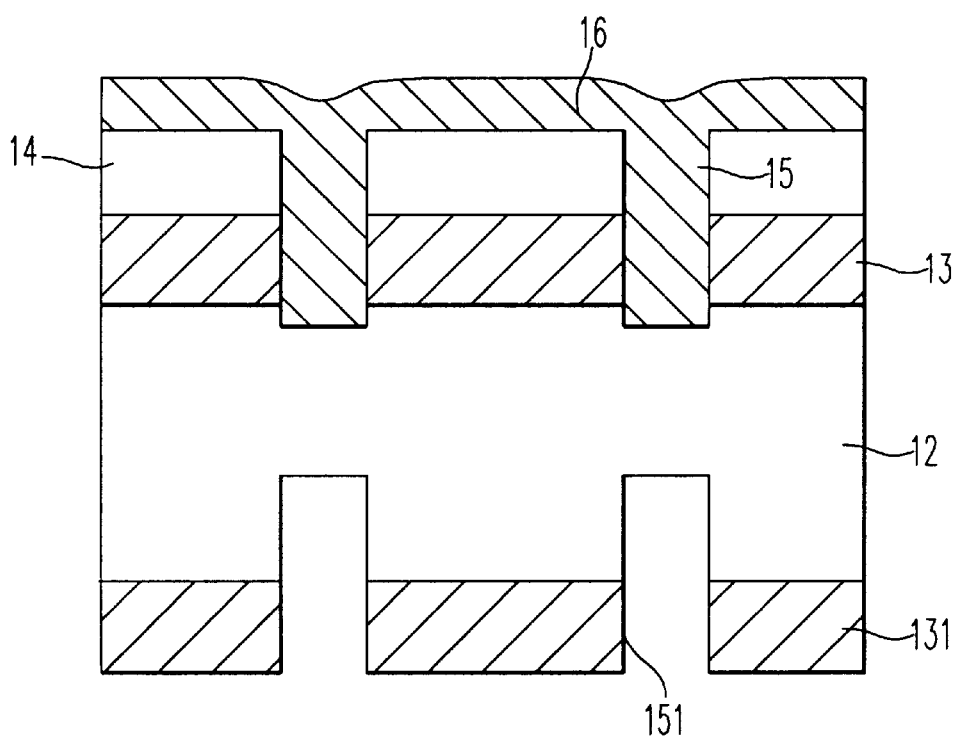
FIG. 24 is a sectional view showing a manufacturing method of the semiconductor device of the fourth embodiment of the present invention using a bonded SOI substrate.
Figure 25:
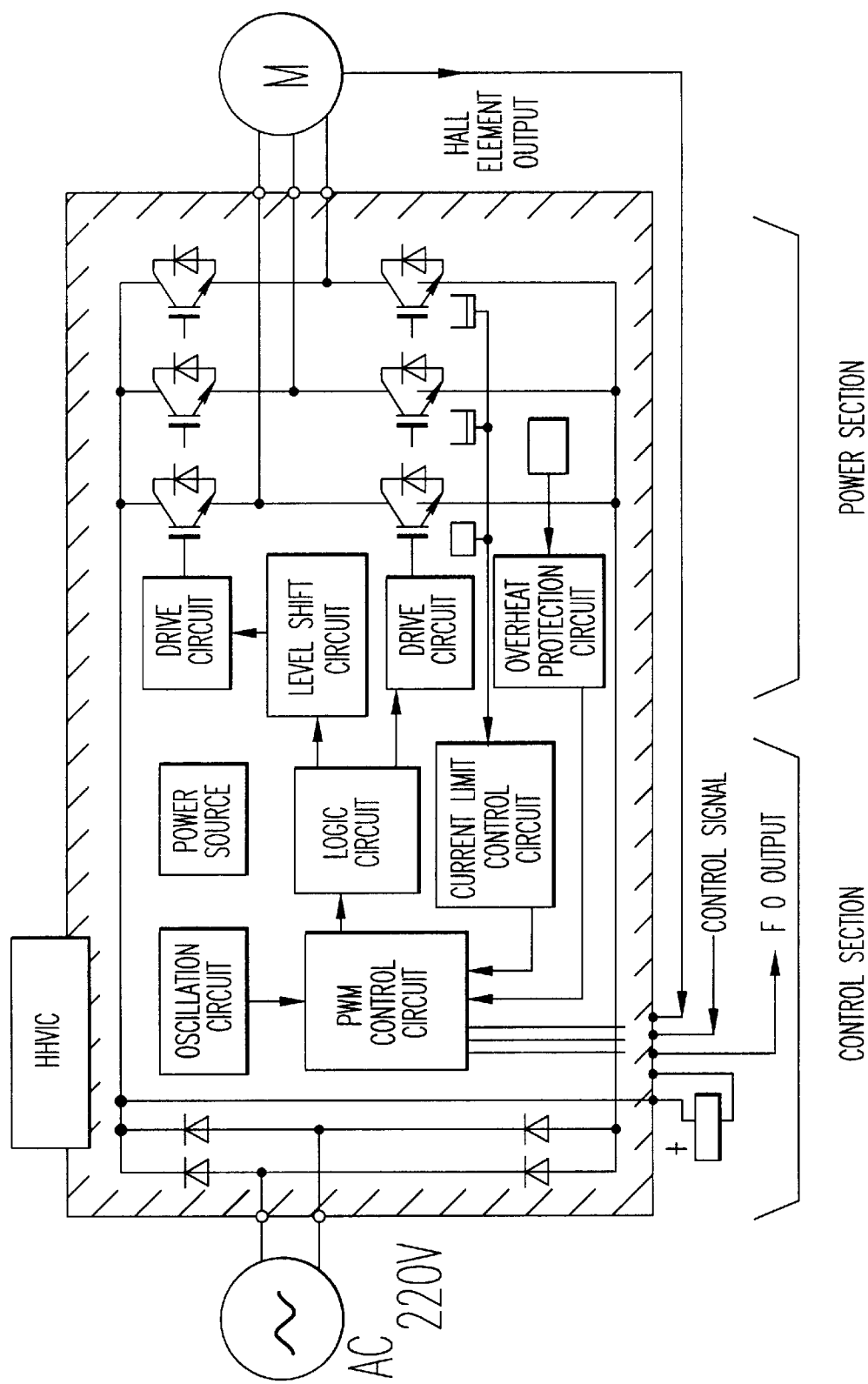
FIG. 25 is a circuit diagram showing a high voltage IC.
Figure 26:
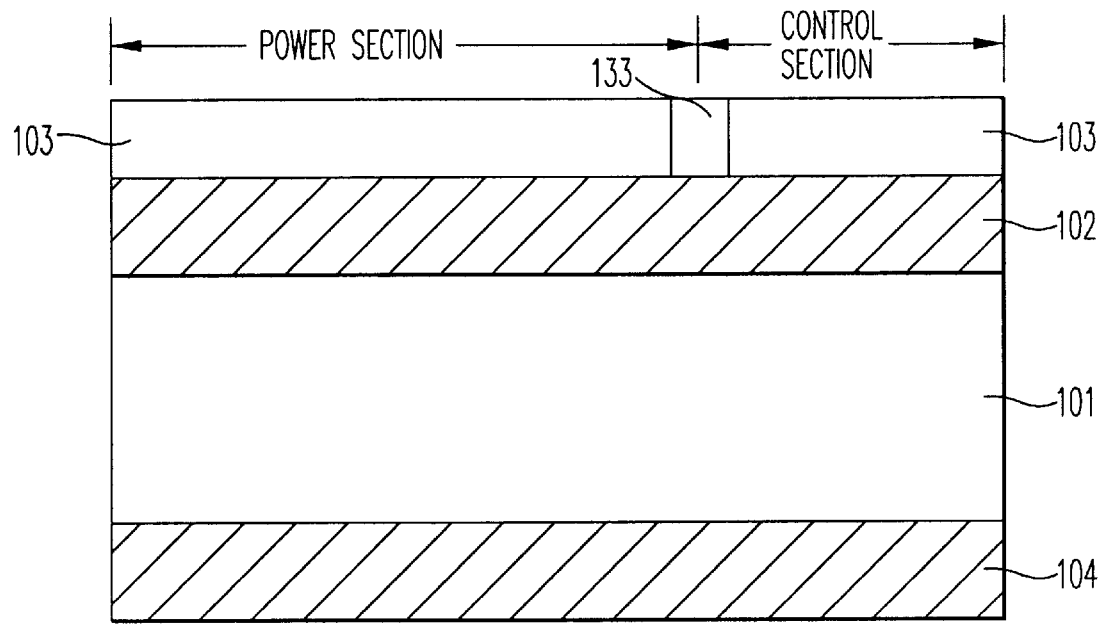
FIG. 26 is a sectional view showing a high voltage IC using a background SOI substrate.
Figure 27:
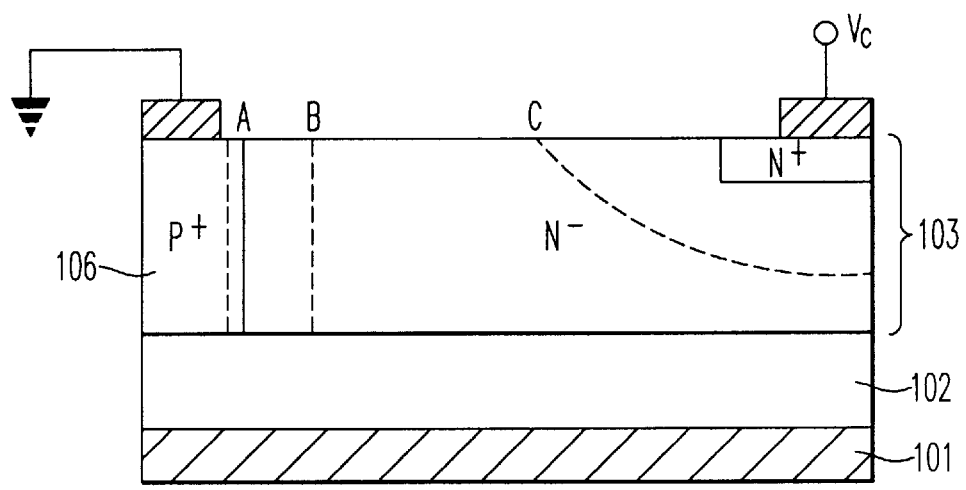
FIG. 27 is a sectional view showing an SOI diode.
Figure 28:
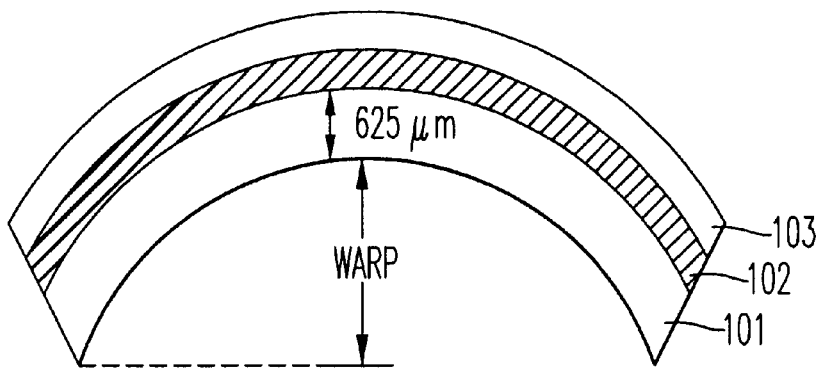
FIG. 28 is a sectional view showing a warp of a semiconductor substrate using a background SOI structure.
Figure 29:
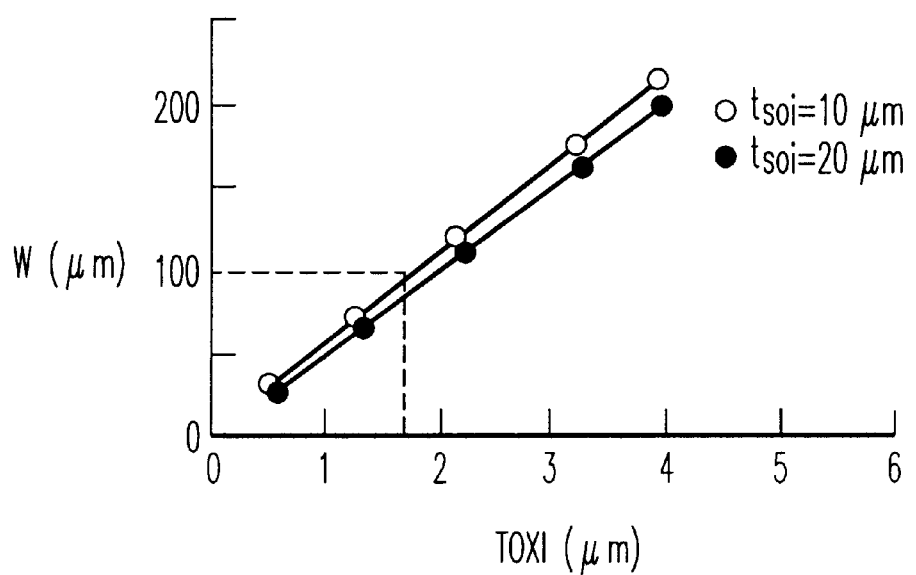
FIG. 29 is a graph showing the relation between an embedded oxide film layer of a background SOI substrate and warp of the substrate.

FIGS. 22 to 24 are sectional views of the semiconductor wafer manufacturing method of the fourth embodiment of the present invention for manufacturing the SOI substrate as shown in FIG. 21 using a bonded SOI substrate. The semiconductor device manufacturing method is described below by referring to FIGS. 22 to 24.

First, as shown in FIG. 22, both sides of the semiconductor substrate 12 are oxidized to form an embedded oxide film 13 and a silicon oxide film layer 131. Then, another semiconductor substrate 14 is bonded to the surface of the oxide film 13 and is then thermally treated to secure a bonding strength. Thereafter, the surface of the semiconductor substrate 13 is polished up to a predetermined thickness to form an SOI layer. These are formed similarly to the case of the first embodiment.

Then, as shown in FIG. 23, double-side photoengraving is performed so that a pattern is formed along a region which does not damage functions of a semiconductor device for each chip, for example, along each dicing line. Then, a trench groove 15 is formed from the front surface of the SOI layer and a trench groove 151 is formed from the rear surface of the silicon oxide layer 131 at the same time. The trench groove 15 is formed so as to pass through the silicon oxide film 13 from the surface of the SOI layer 14 and to reach the semiconductor substrate 12, and the trench groove 151 is formed so as to pass through the silicon oxide film 131 from the surface of the silicon oxide film 131 and to reach the semiconductor substrate 12.

Under the above state, stretching stresses in the embedded oxide film 13 and silicon oxide film 131 are divided to each chip by the trench grooves 15 and 151, and therefore, they are not reflected on the warp of a substrate as a whole. It is preferable that patterns of the trench grooves 15 and 151 coincide with each other from the viewpoint of stress balance. However, a high accuracy is not always required.

Thereafter, a silicon oxide film is formed on the surface of the trench groove 15, and then as shown in FIG. 24, a groove is embedded by deposition of polysilicon, amorphous silicon, or selective epitaxy growth to form the groove embedded region 16. The plane with the trench groove 151 is polished to obtain a flat surface of the semiconductor substrate 12. The polysilicon or silicon which contains impurities may be embedded into the groove embedded region 16 as long as a silicon oxide film formed on the surface of the groove 15 has an adequate insulation performance.

Finally, the bonded SOI substrate shown in FIG. 21 is obtained by accurately etching back and flattening the surface groove embedded region 16 including polysilicon or silicon by the CMP (Chemical Mechanical Polish) method. Subsequently, a series of device processes are performed in the unit region divided by the trench groove 15.

This groove 15 is formed in a region which does not damage functions of a semiconductor device such as a chip dicing line and has the advantage of decreasing a warp of a wafer by dividing and narrowing a range influenced by a stress. Thereby, a stress produced between silicon and silicon oxide films is decreased, and thus, the breakdown voltage of a semiconductor device can be raised and the service life of it can be lengthened.

Moreover, because the SOI layer 14 and the semiconductor substrate 12 are electrically connected to each other by the groove embedded region 16 including polysilicon or a selective epitaxial layer, the advantages of dissolving the condenser effect, which is a general problem in plasma-etching of an SOI substrate, and of stabilizing the etching characteristic are obtained.

Though the above description is made by using a CMOS as an example of a logic circuit, a CMOS transistor may be used independently or in combination with a bipolar transistor. Further, it is possible to use a P-type IGBT or MOS transistor instead of an N-type IGBT as a power device.

Because the present invention is constituted as described above, it has the following advantages.

Because the present invention uses an SOI substrate, it is possible to perform complete dielectric separation and decrease a parasitic capacitance between devices. Moreover, because an insulating layer for relaxing and restraining a stress is formed on both sides of a semiconductor substrate and a protective coat is further formed to protect the insulating layer, the breakdown voltage of a semiconductor device can be raised and the service life of it can be lengthened.

Furthermore, because the protective coat uses a silicon nitride film or polysilicon film having a resistance against an oxide film etchant to form a film-insulating-gate field effect transistor and a MOS transistor for controlling the field effect transistor, generation of a large current and control under low power consumption are realized, and a silicon oxide film for relaxing and restraining a stress is protected. Therefore, the breakdown voltage of a semiconductor device can be raised and the service life of it can be lengthened.

Furthermore, because an SOI substrate is used in which a stress relaxation layer for relaxing a junction stress is formed between a semiconductor substrate and an insulating layer formed on one principal plane of the semiconductor substrate, complete dielectric separation can be made, a parasitic capacitance between devices can be decreased, and moreover the breakdown voltage of a semiconductor device can be raised and the service life of it can be lengthened.

Furthermore, because an SOI substrate obtained by forming a stress relaxation layer for relaxing a junction stress between insulating layers formed on both sides of a semiconductor substrate is used, a stress can further be relaxed and restrained and the service life of the semiconductor substrate can be lengthened.

Furthermore, because a protective coat for protecting an insulating layer is used, a stress can further be relaxed and restrained and a service life can further be lengthened.

In this case, because a stress relaxation layer is made of a porous silicon layer, it is possible to decrease a stretching stress by controlling the porous silicon density and thereby decreasing volume changes before and after oxidation. Therefore, a stress can further be relaxed and restrained and a service life can be lengthened.

Moreover, because the protective coat uses a silicon nitride film or polysilicon film having a resistance against an oxide film etchant to form a film-insulating-gate field effect transistor and a MOS transistor for controlling the field effect transistor, generation of a large current and control under low power consumption are realized, and a silicon oxide film for relaxing and restraining a stress is protected. Therefore, the breakdown voltage of a semiconductor device can be raised and the service life of it can be lengthened.

Furthermore, because a stress relaxation layer is formed between a semiconductor substrate and an insulating layer, the stress produced between the semiconductor substrate and the insulating layer is extremely restrained. Thereby, it is possible to restrain a warpage of an SOI substrate and decrease a trouble such as imperfect attraction or transfer of a wafer to a stage in a process. Therefore, a semiconductor device having a high breakdown voltage and a long service life can be fabricated.

Furthermore, because semiconductor substrates with an insulating layer formed on their both sides are bonded to each other and then polished to form an SOI substrate, the thickness of the insulating layer can easily be increased.

Furthermore, because a stress relaxation layer is formed between both sides of a semiconductor substrate and insulating layers respectively, the stress produced between the semiconductor substrate and insulating layers is extremely restrained. Thereby, a warp of an SOI substrate can be restrained. Thus, it is possible to decrease a trouble such as imperfect attraction or transfer of a wafer to a stage in a process and fabricate a semiconductor device having a high breakdown voltage and a long service life.

Furthermore, because semiconductor substrates with an insulating layer formed on their both sides are bonded to each other and then polished to form an SOI substrate, the thickness of the insulating layer can easily be increased.

Furthermore, because a stress relaxation layer is formed on both sides of a semiconductor substrate in one process, the number of processes is decreased and the stress produced between the semiconductor substrate and insulating layers is extremely restrained. Thereby, because a warp of an SOI substrate can be restrained, it is possible to decrease a trouble such as imperfect attraction or transfer of a wafer to a stage in a process and fabricate a semiconductor device having a high breakdown voltage and a long service life.

Furthermore, because semiconductor substrates with an insulating layer formed on their both sides are bonded to each other and then polished to form an SOI substrate, the thickness of the insulating layer can easily be increased.

Furthermore, because an insulating layer and a stress relaxation layer formed on a side of a semiconductor substrate on which no device is formed are removed by polishing them after forming a device, a warp of an SOI substrate can be restrained. Therefore, it is possible to decrease a trouble such as imperfect attraction or transfer of a wafer to a stage in a process.

Furthermore, because silicon oxide film thickness reduction caused in semiconductor device manufacturing processes is prevented by forming a protective coat for protecting an insulating layer, the stress produced between a semiconductor substrate and a silicon oxide film is extremely restrained. Thereby, because a warpage of an SOI substrate can be restrained, it is possible to decrease a trouble such as imperfect attraction or transfer of a wafer to a stage in a process.

In this case, because a stress relaxation layer is made of a porous silicon layer, it is possible to decrease a stretching stress by controlling the porous silicon density and thereby decreasing volume changes before and after oxidation and decreasing a stretching stress. Therefore, a stress can further be relaxed and restrained and a service life can be lengthened.

Moreover, a protective coat uses a silicon nitride film or polysilicon film having a resistance against an oxide film etchant, and thereby a silicon oxide film for relaxing and restraining a stress is protected and a warp of an SOI substrate can further be restrained. Therefore, it is possible to decrease a trouble such as imperfect attraction or transfer of a wafer to a stage in a process.

Furthermore, because a groove for dividing an insulating layer is formed, a junction stress working between a semiconductor substrate and an insulating layer is relaxed to extremely restrain a stress, and therefore a warp of an SOI substrate can be restrained or decreased. Thus, it is possible to decrease a trouble such as imperfect attraction or transfer of a wafer to a stage in a process and fabricate a semiconductor device having a high breakdown voltage and a long service life.

Furthermore, because a groove for dividing and narrowing a range influenced by a stress is formed in a chip dicing line, it is possible to restrain or decrease a warp of an SOI substrate without damaging functions of a semiconductor device. Therefore, it is possible to improve a trouble such as imperfect attraction or transfer of a wafer to a stage in a process and fabricate a semiconductor device having a high breakdown voltage and a long service life.

Furthermore, because the groove is filled with polysilicon, amorphous silicon, or single-crystal silicon so as to electrically connect an SOI layer with a semiconductor substrate, the advantages of dissolving the condenser effect, which is a problem for plasma-etching an SOI substrate in general, and stabilizing the etching characteristic are obtained.

It is further understood that the foregoing description is preferred embodiments of the disclosed device and that various changes and modifications may be made in the invention without departing from the spirit and scope thereof.

What is claimed as new and desired to be secured by Letters Patent of the United States is:

1. A semiconductor device comprising:
    a semiconductor substrate having a first principal plane and a second principal plane;

a first stress relaxation layer formed on said first principal plane of said semiconductor substrate;

a first insulating layer formed on said first stress relaxation layer;

a silicon layer formed on said first insulating layer;

a second stress relaxation layer formed on said second principal plane of said semiconductor substrate;

a second insulating layer formed on said second stress relaxation layer;

a first element device formed on a first portion of an exposed plane of said silicon layer; and a second element device, for controlling the first element device, formed on a second portion separated from the first portion of said exposed plane of said silicon layer by a device separation region.

2. The semiconductor device according to claim 1, further comprising a protective coat formed on a principal plane of said second insulating layer to protect said second insulating layer.

3. The semiconductor device according to claim 1, wherein said first and second insulating layers comprise silicon oxide films, and said first and second stress relaxation layers comprise porous silicon layers.

4. A semiconductor device comprising:

a semiconductor substrate having a first principal plane and a second principal plane;

a first stress relaxation layer comprised of a porous silicon layer formed on a principal plane of said semiconductor substrate;

a first insulating layer comprised of a silicon oxide layer formed on said first stress relaxation layer;

a silicon layer formed on said first insulating layer;

a first element device formed on a first portion of an exposed plane of said silicon layer; and a second element device, for controlling the first element device, formed on a second portion separated from the first portion of said exposed plane of said silicon layer by a device separation region.

5. A semiconductor device comprising:

a semiconductor substrate having a first principal plane and a second principal plane;

a first stress relaxation layer formed on a first principal plane of said semiconductor substrate;

a first insulating layer formed on said first stress relaxation layer;

a silicon layer formed on said first insulating layer;

a second stress relaxation layer formed on said second principal plane of said semiconductor substrate;

a second insulating layer formed on said second stress relaxation layer; and at least one element device formed on an exposed plane of said silicon layer.

6. The semiconductor device according to claim 5, further comprising a protective coat formed on a principal plane of said second insulating layer to protect said second insulating layer.

7. The semiconductor device according to claim 5, wherein said first and second insulating layers comprise silicon oxide films, and said first and second stress relaxation layers comprise porous silicon layers.

8. A semiconductor device comprising:

a semiconductor substrate having a first principal plane and a second principal plane;

a first stress relaxation layer comprised of a porous silicon layer formed on a first principal plane of said semiconductor substrate;

a first insulating layer comprised of a silicon oxide layer formed on said first stress relaxation layer;

a silicon layer formed on said first insulating layer; and at least one element device formed on an exposed plane of said silicon layer.

* * * * *